(12) United States Patent
Chang et al.

(10) Patent No.: US 12,072,374 B2
(45) Date of Patent: Aug. 27, 2024

(54) DETECTION PAD STRUCTURE FOR ANALYSIS IN A SEMICONDUCTOR DEVICE

(71) Applicant: Samsung Electronics Co., Ltd., Suwon-si (KR)

(72) Inventors: Jihoon Chang, Yongin-si (KR); Yeonjin Lee, Suwon-si (KR); Minjung Choi, Suwon-si (KR); Jimin Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 355 days.

(21) Appl. No.: 17/540,745

(22) Filed: Dec. 2, 2021

(65) Prior Publication Data

US 2022/0326301 A1 Oct. 13, 2022

(30) Foreign Application Priority Data

Apr. 9, 2021 (KR) ........................ 10-2021-0046242

(51) Int. Cl.
*G01R 31/28* (2006.01)
*H01L 23/00* (2006.01)
(Continued)

(52) U.S. Cl.
CPC ...... *G01R 31/2884* (2013.01); *H01L 23/5226* (2013.01); *H01L 23/528* (2013.01);
(Continued)

(58) Field of Classification Search
CPC ... H01L 2224/0553; H01L 2224/06131; H01L 2224/14131; H01L 22/32; H01L 22/34;
(Continued)

(56) References Cited

U.S. PATENT DOCUMENTS 5,856,053 A * 1/1999 Watanabe ........... G03F 7/70558
430/22
6,815,285 B2 11/2004 Choi et al.
(Continued)

FOREIGN PATENT DOCUMENTS

JP 2012-0151272 A 8/2012
KR 10-0538094 A 12/2004
(Continued)

OTHER PUBLICATIONS

Taiwanese Office Action and Search Report dated Aug. 1, 2022 issued in Taiwanese Patent Application No. 110148308.

*Primary Examiner* — Galina G Yushina
(74) *Attorney, Agent, or Firm* — Harness, Dickey & Pierce, P.L.C.

(57) ABSTRACT

A detection pad structure in a semiconductor device may include a lower wiring on a substrate, an upper wiring on the lower wiring, and a first pad pattern on the upper wiring. The upper wiring may be connected to the lower wiring and include metal patterns and via contacts on the metal patterns that are stacked in a plurality of layers. The first pad pattern may be connected to the upper wiring. A semiconductor device may include an actual upper wiring including actual metal patterns and actual via contacts stacked in a plurality of layers. At least one of the metal patterns of each layer in the upper wiring may have a minimum line width and a minimum space of the metal patterns of each layer in the actual upper wiring. Metal patterns and via contacts of each layer in the upper wiring may be regularly and repeatedly arranged.

20 Claims, 14 Drawing Sheets

(51) Int. Cl.
*H01L 23/522* (2006.01)
*H01L 23/528* (2006.01)

(52) U.S. Cl.
CPC .............. *H01L 24/05* (2013.01); *H01L 24/06* (2013.01); *H01L 2224/05097* (2013.01); *H01L 2224/06515* (2013.01)

(58) Field of Classification Search
CPC ................ H01L 23/5283; H01L 23/00; H01L 2224/06515; H01L 2224/0392; H01L 2224/05093; H01L 24/14; H01L 2224/0401; H01L 2224/0404; H01L 23/5226; H01L 23/528; H01L 24/05; H01L 24/06; H01L 2224/0509; G01R 31/2884
See application file for complete search history.

(56) References Cited

U.S. PATENT DOCUMENTS

| | | | |
|---|---|---|---|
| 6,876,078 | B2 | 4/2005 | Kim et al. |
| 7,067,420 | B2 | 6/2006 | Choi et al. |
| 7,081,409 | B2 | 7/2006 | Kang et al. |
| 7,098,131 | B2 | 8/2006 | Kang et al. |
| 7,105,444 | B2 | 9/2006 | Choi et al. |
| 7,148,100 | B2 | 12/2006 | Kim et al. |
| 7,241,636 | B2 | 7/2007 | Hess et al. |
| 7,244,645 | B2 | 7/2007 | Kim et al. |
| 7,247,552 | B2 | 7/2007 | Pozder et al. |
| 7,253,531 | B1 | 8/2007 | Huang et al. |
| 7,452,811 | B2 | 11/2008 | Choi et al. |
| 7,459,792 | B2 | 12/2008 | Chen |
| 7,476,983 | B2 | 1/2009 | Kim et al. |
| 7,739,636 | B2 | 6/2010 | Collins et al. |
| 7,800,227 | B2 | 9/2010 | Kamiyama et al. |
| 7,833,855 | B2 | 11/2010 | Kang et al. |
| 8,261,229 | B2 | 9/2012 | Hart |
| 8,993,369 | B2 | 3/2015 | Maruyama et al. |
| 9,768,221 | B2 | 9/2017 | Wu et al. |
| 10,163,831 | B2 | 12/2018 | Singh et al. |
| 10,748,846 | B2 | 8/2020 | Oh et al. |
| 10,777,507 | B2 | 9/2020 | Deguchi et al. |
| 2003/0017697 | A1 | 1/2003 | Choi et al. |
| 2003/0219942 | A1 | 11/2003 | Choi et al. |
| 2004/0224506 | A1 | 11/2004 | Choi et al. |
| 2005/0136652 | A1 | 6/2005 | Kim et al. |
| 2006/0251812 | A1 | 11/2006 | Kang et al. |
| 2007/0026621 | A1 | 2/2007 | Cho et al. |
| 2007/0059929 | A1 | 3/2007 | Cho et al. |
| 2008/0012046 | A1* | 1/2008 | Ojiro ............... H01L 22/32 257/E23.153 |
| 2008/0208499 | A1* | 8/2008 | Miyashita .......... G01M 11/0264 356/124 |
| 2009/0020842 | A1* | 1/2009 | Shiau ................ H01L 27/14636 257/459 |
| 2015/0001658 | A1* | 1/2015 | Wu ................... H01L 24/05 257/432 |
| 2016/0233171 | A1* | 8/2016 | Kim ................... H01L 21/822 |
| 2019/0019833 | A1 | 1/2019 | Kodaira et al. |
| 2020/0303268 | A1* | 9/2020 | Kim ................... H01L 24/05 |
| 2020/0411393 | A1* | 12/2020 | Kim ................... H01L 23/3128 |
| 2021/0055866 | A1 | 2/2021 | Fujimoto et al. |
| 2021/0104479 | A1* | 4/2021 | Park ................... H01L 24/48 |
| 2022/0302049 | A1* | 9/2022 | Li ..................... H01L 22/34 |

FOREIGN PATENT DOCUMENTS

| | | |
|---|---|---|
| KR | 10-2008-0008045 A | 1/2008 |
| KR | 10-2011-0079274 A | 7/2011 |
| TW | 200525744 A | 8/2005 |
| TW | 202046177 A | 12/2020 |

* cited by examiner

SECOND DIRECTION ↑ → FIRST DIRECTION

SECOND
DIRECTION

FIRST
DIRECTION

DETECTION PAD STRUCTURE FOR ANALYSIS IN A SEMICONDUCTOR DEVICE

CROSS-REFERENCE TO RELATED APPLICATION

This application claims priority under 35 USC § 119 to Korean Patent Application No. 10-2021-0046242 filed on Apr. 9, 2021, in the Korean Intellectual Property Office (KIPO), the contents of which are incorporated by reference herein in their entirety.

BACKGROUND

Some example embodiments relate to a detection pad structure for analysis in a semiconductor device.

In general, a semiconductor device may include circuit patterns, and wiring and pad patterns for electrically connecting the circuit patterns. A plurality of pad patterns may include a metal having low resistance. Some of the pad patterns may serve as a detection pad pattern for a surface analysis of the pad patterns. Further, detection wirings (or, detection interconnection wirings) may be formed under the detection pad pattern.

SUMMARY

Some example embodiments provide a detection pad structure for a surface analysis of pad structures and/or a structural analysis of wirings in a semiconductor device.

According to some example embodiments, there is provided a detection pad structure in a semiconductor device. The detection pad structure includes a lower wiring on a substrate, an upper wiring on the lower wiring, the upper wiring electrically connected to the lower wiring, the upper wiring including metal patterns and via contacts on the metal patterns, the metal patterns and via contacts stacked in a plurality of layers, and a first pad pattern on the upper wiring, the first pad pattern electrically connected to the upper wiring. A semiconductor device is on the substrate, the semiconductor device including an actual upper wiring including actual metal patterns and actual via contacts, the actual metal patterns and actual via contacts stacked in a plurality of layers. At least one of the metal patterns of each layer in the upper wiring has a minimum line width and a minimum space, the minimum line width and the minimum space of the at least one of the metal patterns in the upper wiring corresponding to a minimum line width and a minimum space of a corresponding actual metal pattern of the actual upper wiring. The metal patterns and via contacts of each layer in the upper wiring are regularly arranged and repeatedly arranged.

According to some example embodiments, there is provided a detection pad structure in a semiconductor device. The detection pad structure includes a first pad pattern apart from an upper surface of a substrate, a first detection upper wiring between the substrate and the first pad pattern, the first detection upper wiring and the first pad pattern stacked in a vertical direction that is perpendicular to the upper surface of the substrate, the first pad pattern including metal patterns stacked in a plurality of layers, and the first detection upper wiring configured to analyze a line width and a line space of the metal patterns of each layer, the metal patterns at an edge portion, the edge portion having a rectangular ring shape and corresponding to a portion facing under the first pad pattern, and a second detection upper wiring between the substrate and the first pad pattern stacked in the vertical direction, the second detection upper wiring including metal patterns and via contacts on the metal patterns stacked in a plurality of layers, the second detection upper wiring at a center portion corresponding to a portion facing under an inside of the edge portion. The first pad pattern is directly and electrically connected to the substrate through the first detection upper wiring and the second detection upper wiring.

According to some example embodiments, there is provided a detection pad structure in a semiconductor device. The detection pad structure includes lower wirings on a substrate, a first upper wiring on the lower wirings, the first upper wiring including a first metal pattern and a first via contact on the first metal pattern, a second upper wiring on the first upper wiring, the second upper wiring including a second metal pattern and a second via contact on the second metal pattern, a third upper wiring on the second upper wiring, the third upper wiring including a third metal pattern and a third via contact on the third metal pattern, a fourth upper wiring on the third upper wiring, the fourth upper wiring including a fourth metal pattern and a fourth via contact on the fourth metal pattern, an uppermost wiring on the fourth upper wiring, the upper wiring including an uppermost metal pattern and an uppermost via contact, and a first pad pattern on the uppermost wiring. The first, second, third, and fourth metal patterns and the upper wiring are between the substrate and the first pad pattern arranged in a vertical direction that is perpendicular to an upper surface of the substrate, and the first, second, third, and fourth metal patterns and the upper wiring are at an edge portion, the edge portion having a rectangular ring shape, the edge portion corresponding a portion facing under an edge of the first pad pattern. The first, second, and third metal patterns and the first, second, and third via contacts are between the substrate and the first pad pattern in the vertical direction, and the first, second and third metal patterns and the first, second, and third via contacts are at a center portion, the center portion corresponding a portion facing under of an inside of the edge of the first pad pattern. Each of the first, second and third via contacts at the center portion is within a line width of each of the first, second and third metal patterns contacting bottoms of each of the first, second and third via contacts, and at least one of the first, second, and third via contacts is on the line width of a respective one of the first, second and third metal pattern.

In some example embodiments, when a surface analysis of the pad patterns is performed using the detection pad structure, noise may be reduced during the surface analysis, and thus surfaces of the pad patterns may be more accurately analyzed. Alternatively or additionally, results of the surface analysis of the pad patterns in each of semiconductor devices may be compared with each other. When a cross-sectional structural analysis, e.g. a scanning electron microscope (SEM) analysis and/or a transmission electron microscope (TEM) analysis of wirings of each layer, is performed using the detection pad structure, a cross-sectional structure of the wirings may be more accurately analyzed while reducing the number of samples used for analysis.

BRIEF DESCRIPTION OF THE DRAWINGS

Some example embodiments will be more clearly understood from the following detailed description taken in conjunction with the accompanying drawings.

FIG. 1 is a plan view illustrating pad patterns included in a semiconductor device in accordance with some example embodiments;

FIGS. 2 and 3 are cross-sectional views of the detection pad structure in a semiconductor device in accordance with some example embodiments;

FIGS. 4 to 12 are plan views of each layer of the detection pad structure in the semiconductor device;

FIG. 13 is a cross-sectional view of a detection pad structure in accordance with some example embodiments cut in the second direction;

FIG. 14 is a cross-sectional view of a detection pad structure in accordance with some example embodiments cut in the first direction; and FIG. 15 is a plan view of one of via contacts and metal contacts in the detection pad structure in accordance with some example embodiments.

DESCRIPTION OF SOME EXAMPLE EMBODIMENTS

Hereinafter, two directions parallel to an upper surface of a substrate and perpendicular to each other are referred to as a first direction and a second direction, respectively, and a direction perpendicular to the upper surface of the substrate is referred to as a vertical direction.

Figure 1:
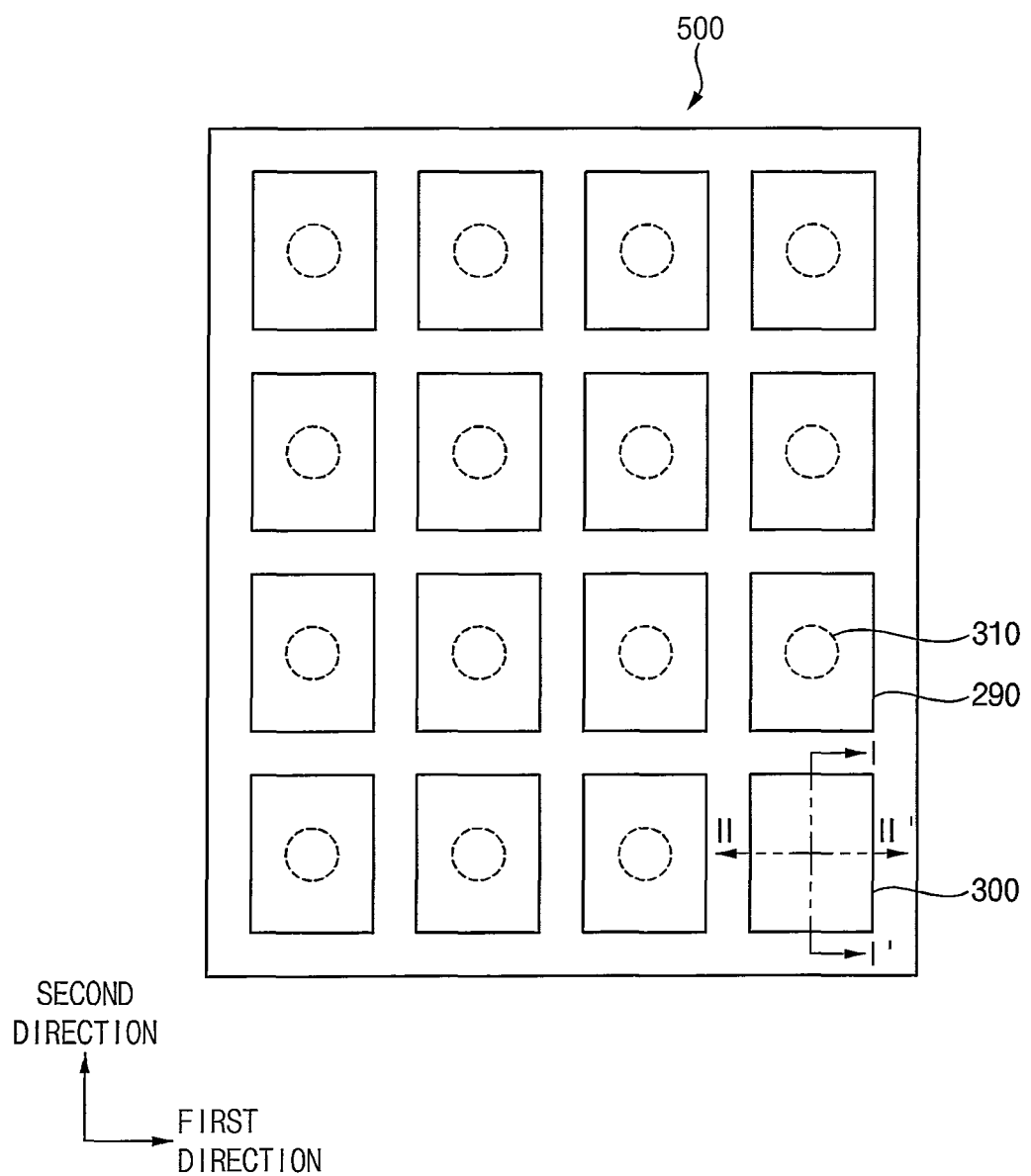
FIG. 1 to 15 represent non-limiting, example embodiments as described herein.

FIG. 1 is a plan view illustrating pad patterns included in a semiconductor device in accordance with some example embodiments.

Referring to FIG. 1, the semiconductor device 500 may include a lower structure including circuit patterns and lower wirings on a substrate, and an upper structure including upper wirings, and may include pad patterns 290 and 300 on the lower structure.

The pad patterns 290 and 300 may include a first pad pattern 300 serving as or configured as a detection pad pattern for a surface analysis of the pad patterns, and second pad patterns 290 serving as or configured as an active or actual electrical pad in the semiconductor device 500.

In FIG. 1, only one first pad pattern 300 is shown in the semiconductor device, but example embodiments are not limited thereto, and two or more first pad patterns may be formed in the semiconductor device.

The second pad pattern 290 may be electrically connected to the circuit patterns through the upper wirings and the lower wirings.

In some example embodiments, each of the first and second pad patterns 300 and 290 may have a rectangular shape such as a square shape, and an upper surface of each of the first and second pad patterns 300 and 290 may have substantially the same size or same area. The first and second pad patterns 300 and 290 may include a low-resistance metal material, and may be or may include the same material. The first and second pad patterns 300 and 290 may include, e.g., aluminum.

In the semiconductor device (e.g., a semiconductor chip or a semiconductor package), an electrical connection member may contact the upper surface of the second pad pattern 290. In some example embodiments, a conductive bump 310 may be formed on the second pad pattern 290, and may or may not be formed on the first pad pattern 300. In some example embodiments, a wire may be bonded on the second pad pattern 290.

The first pad pattern 300 may serve as or be configured as a detection pad pattern for the surface analysis of the first pad pattern 300, so that the first pad pattern 300 may not be an actual electrical pad in the semiconductor device, and may or may not be floating during operation of the semiconductor device.

In some example embodiments, as shown in FIG. 1, the electrical connection member may not be formed on the first pad pattern 300. For example, the conductive bump and/or the wire may not be formed on the first pad pattern 300 in the semiconductor device.

In some example embodiments, the electrical connection member may be formed on the first pad pattern 300. For example, the conductive bump may be formed on the first pad pattern 300, for a bonding stability and/or an ease of manufacturability.

A detection pad structure may include the first pad pattern 300, and structures electrically connected to the first pad pattern 300 and disposed vertically downward from a lower surface of the first pad pattern 300. The surface analysis of the pad pattern and a cross-sectional structural analysis (such as a cross-sectional scanning electron microscope and/or transmission electron microscope) of the wirings included in the semiconductor device may be performed using the detection pad structure. Hereinafter, the detection pad structure having a suitable structure for the surface analysis of the pad pattern and the cross-sectional structural analysis of the wirings in a semiconductor device is described.

Figure 2:
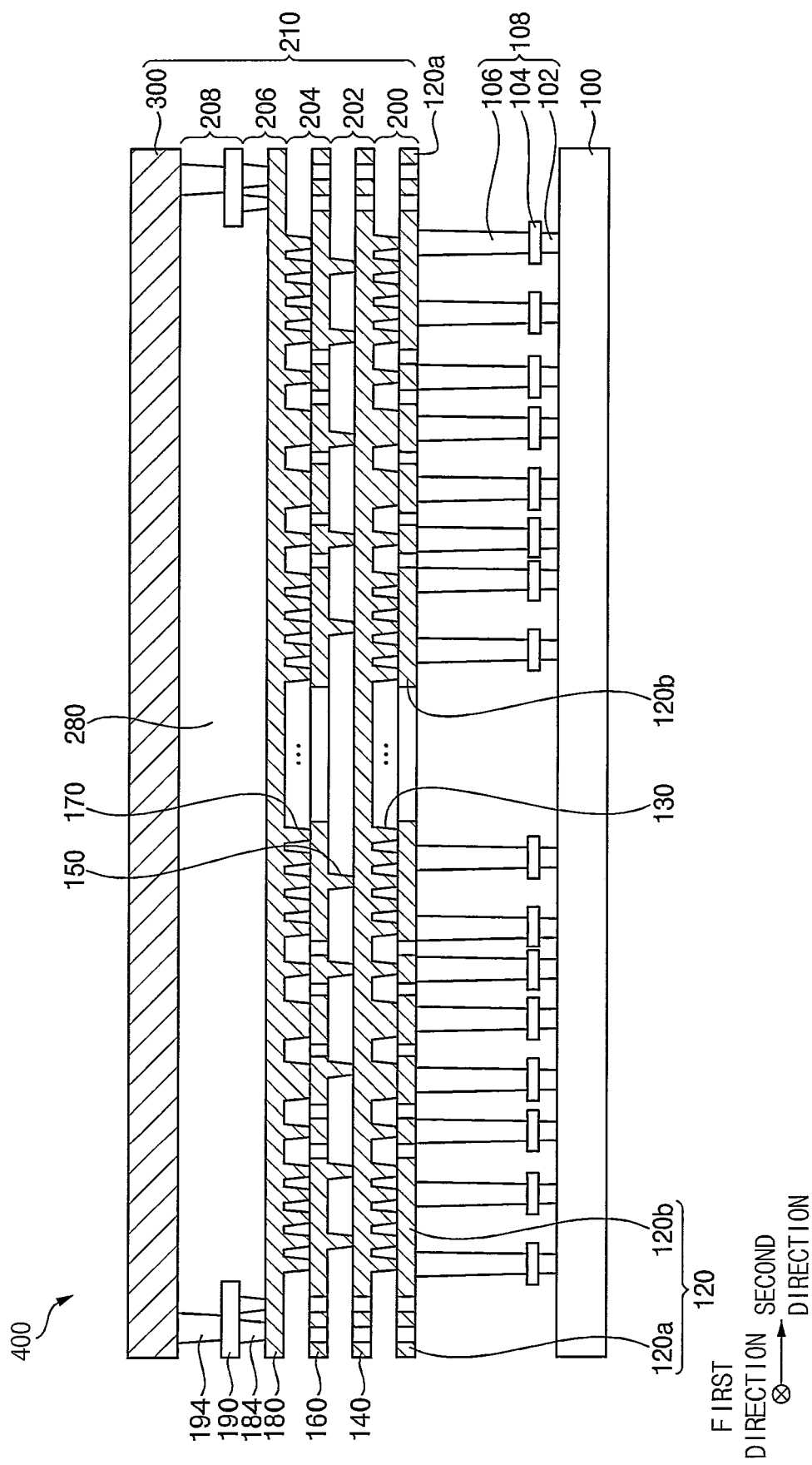
Figure 3:
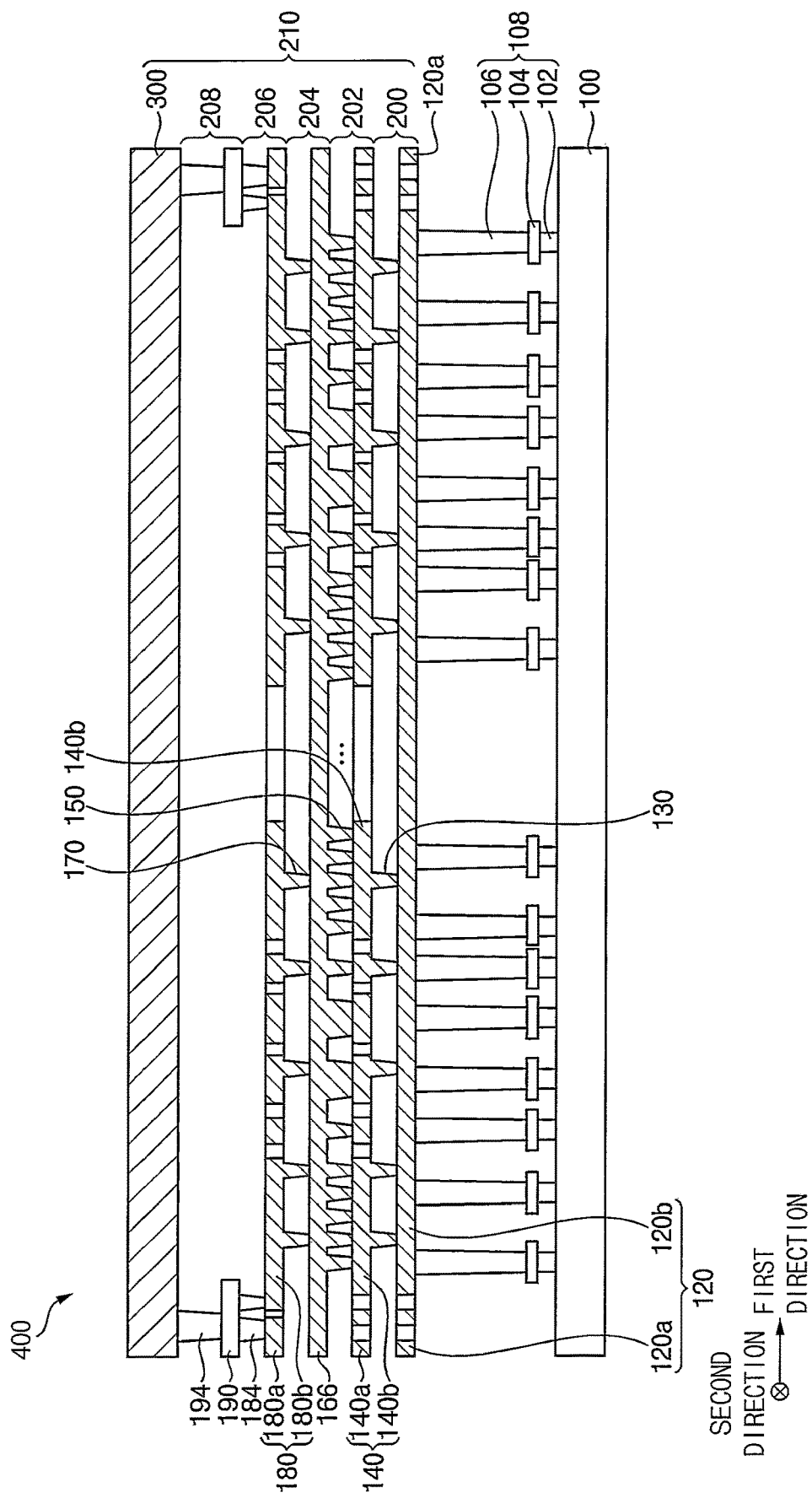

FIGS. 2 and 3 are cross-sectional views of the detection pad structure in a semiconductor device in accordance with example embodiments. FIGS. 4 to 12 are plan views of each layer of the detection pad structure in the semiconductor device.

FIG. 2 is the cross-sectional view taken along the second direction in the detection pad structure, and FIG. 3 is the cross-sectional view taken along the first direction of the detection pad structure. For example, FIG. 2 is the cross-sectional view taken along line I-I' of FIG. 1, and FIG. 3 is the cross-sectional view taken along line II-II' of FIG. 1.

Figure 4:
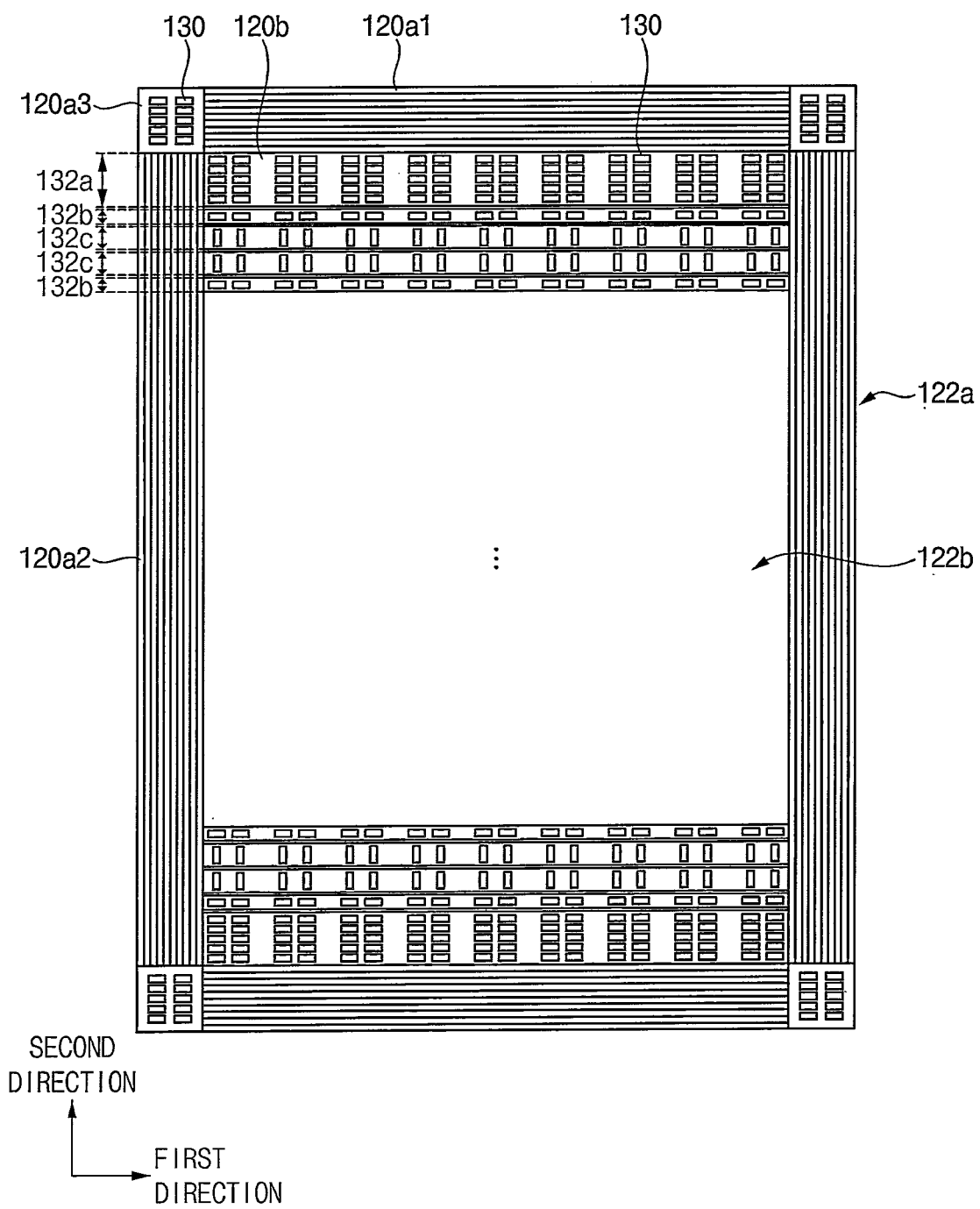
Figure 5:
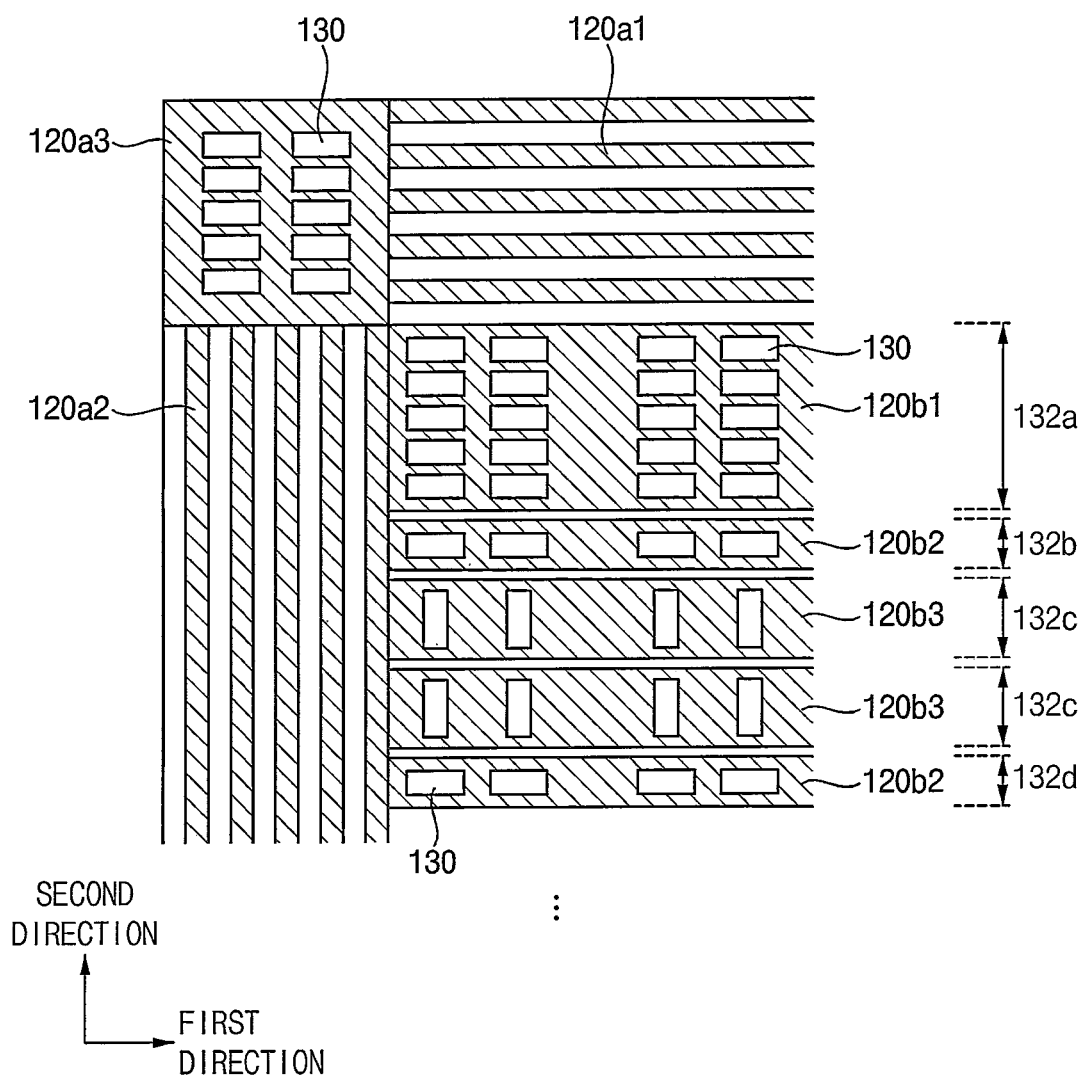
Figure 6:
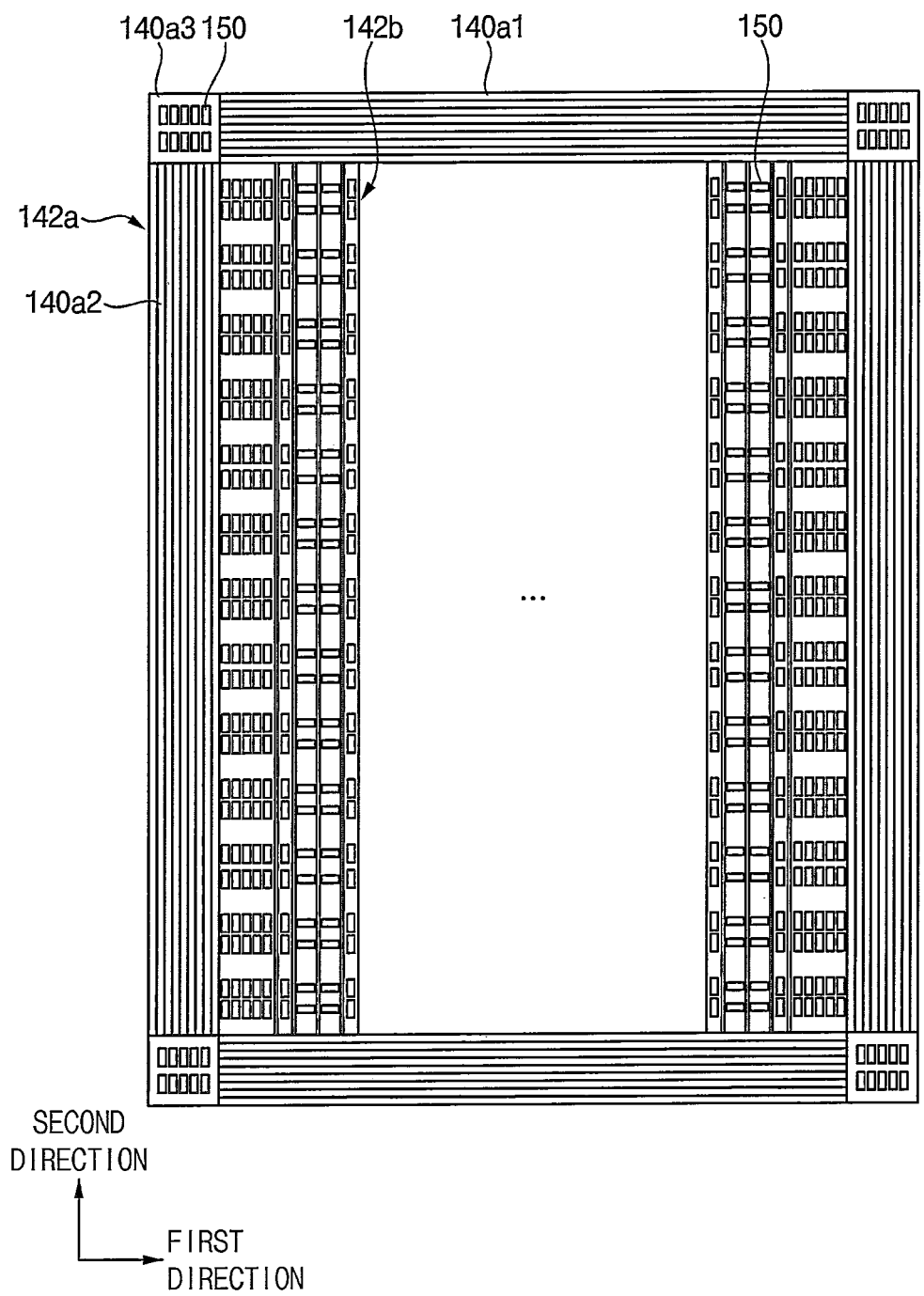
Figure 7:
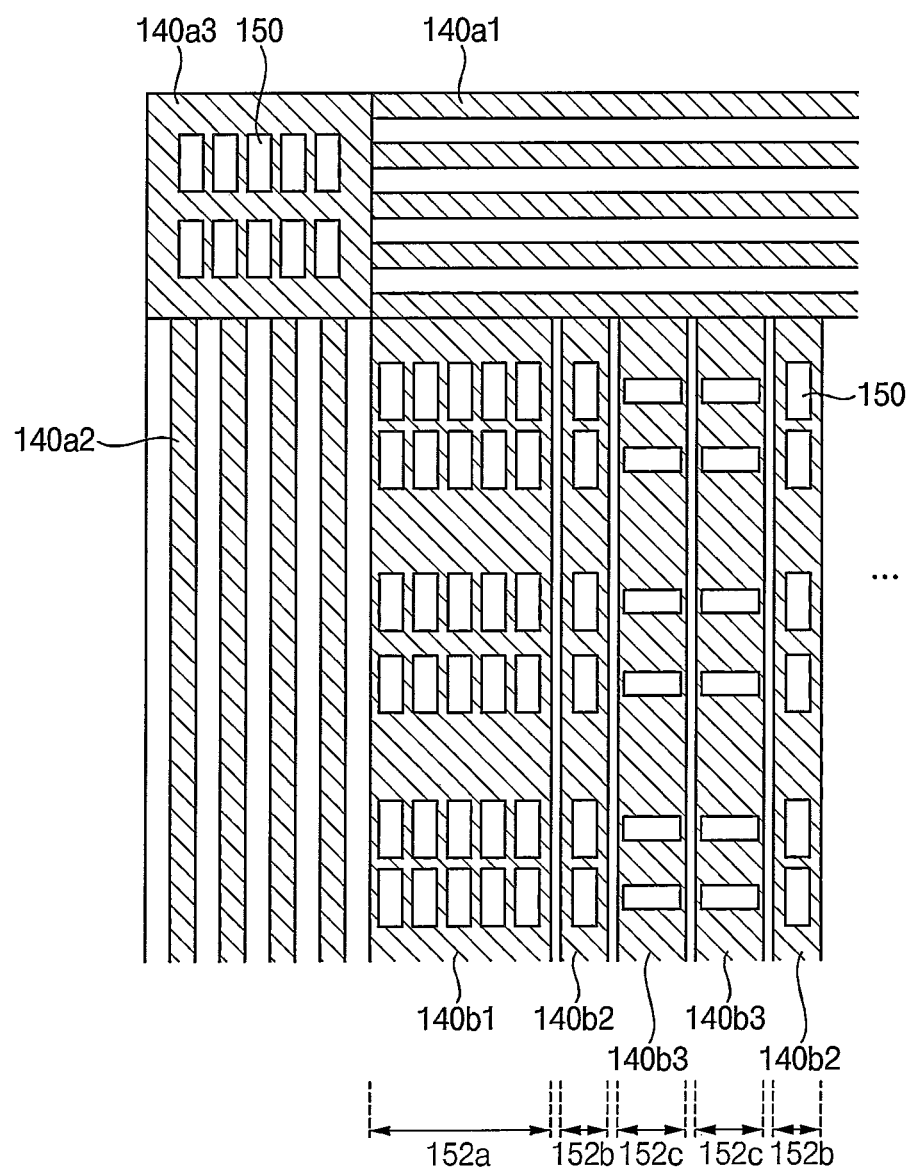
Figure 8:
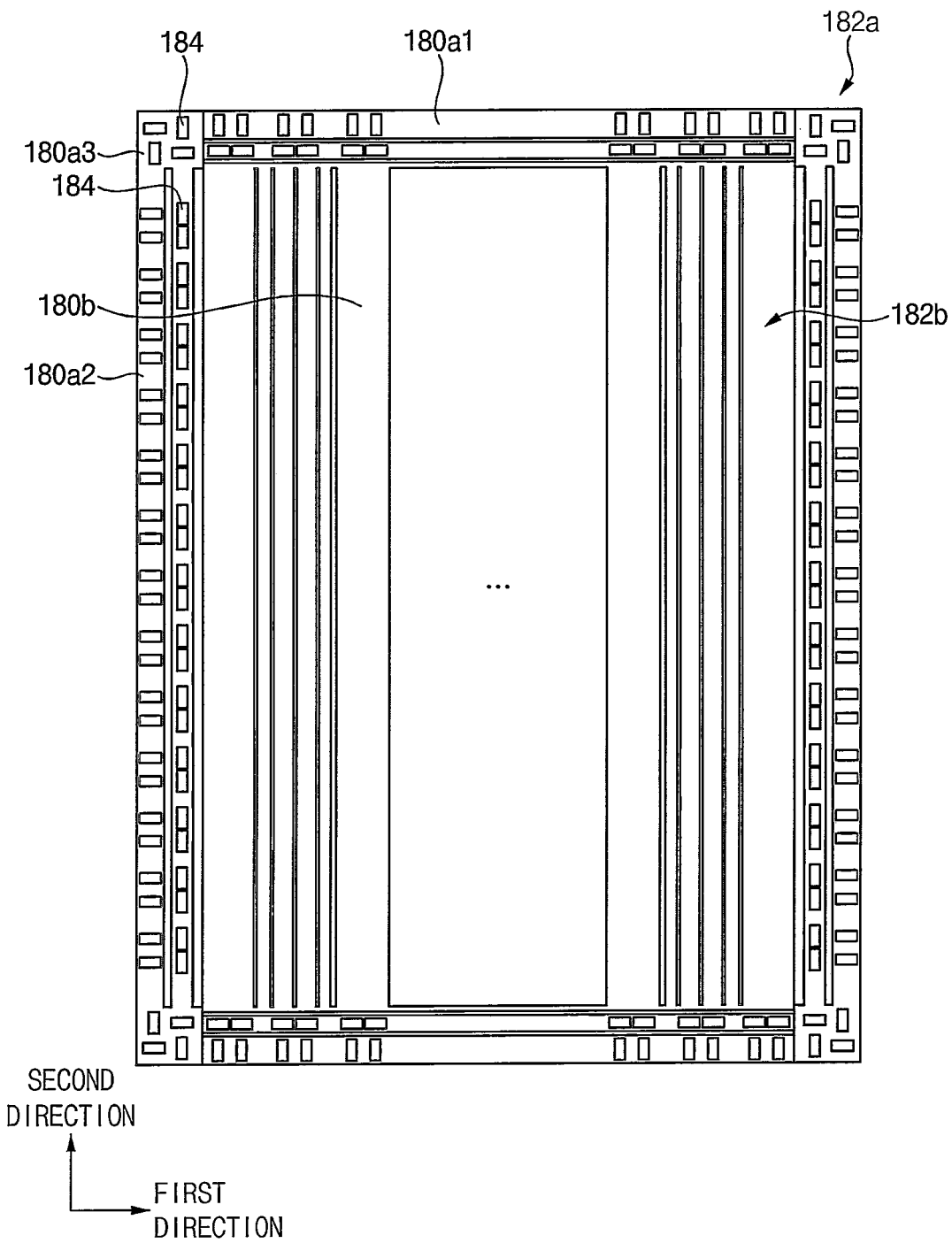
Figure 9:
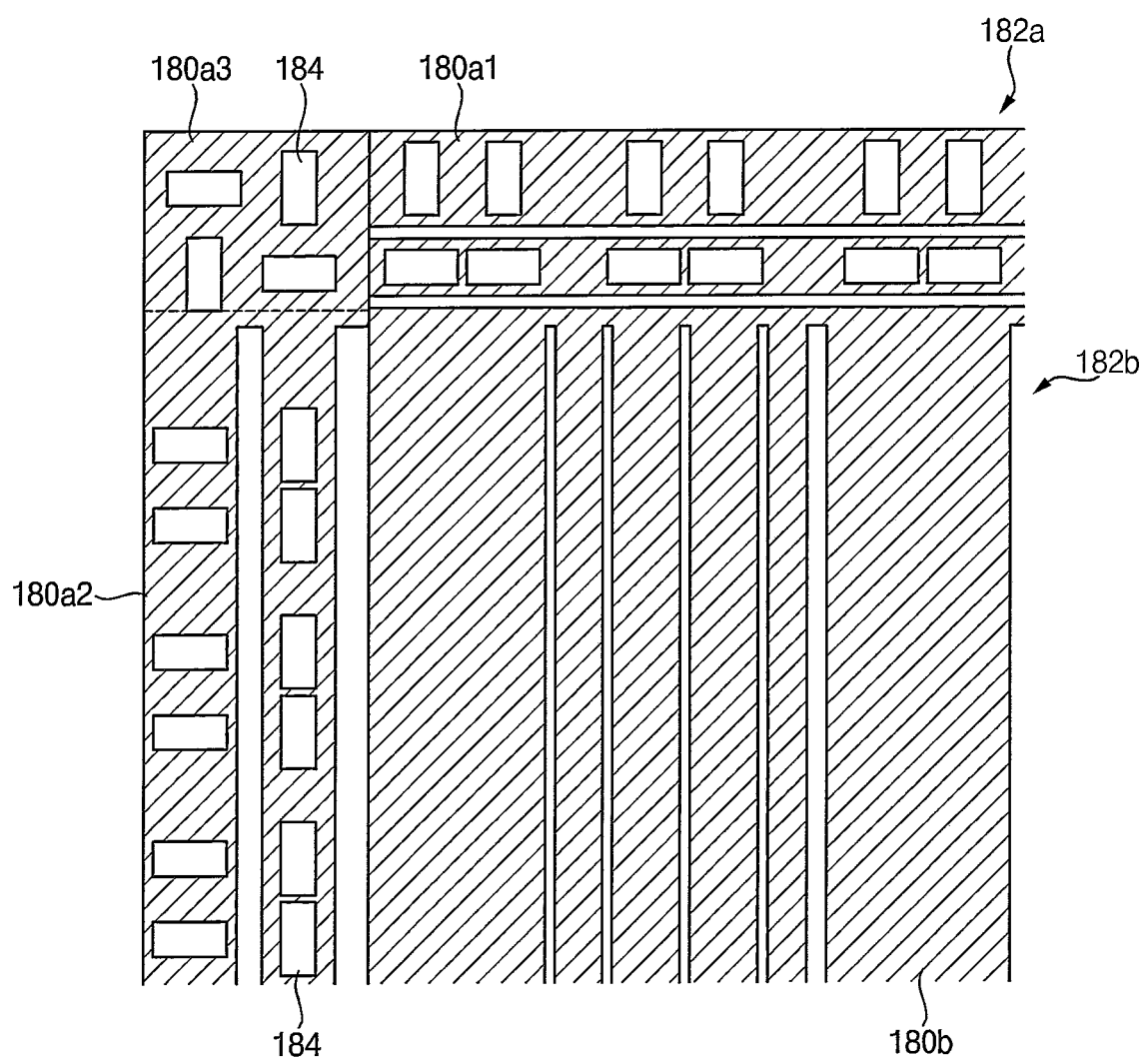
Figure 10:
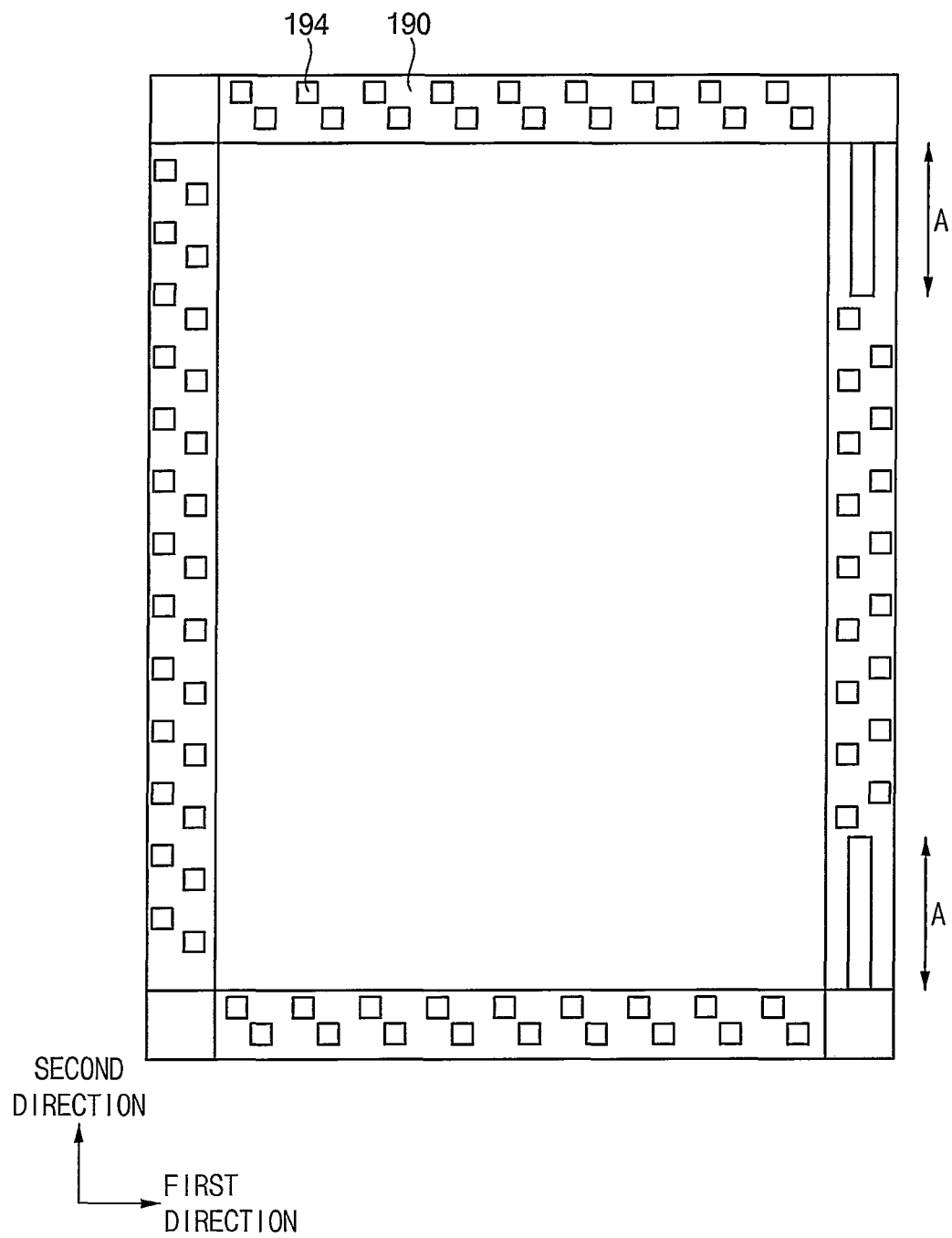
Figure 11:
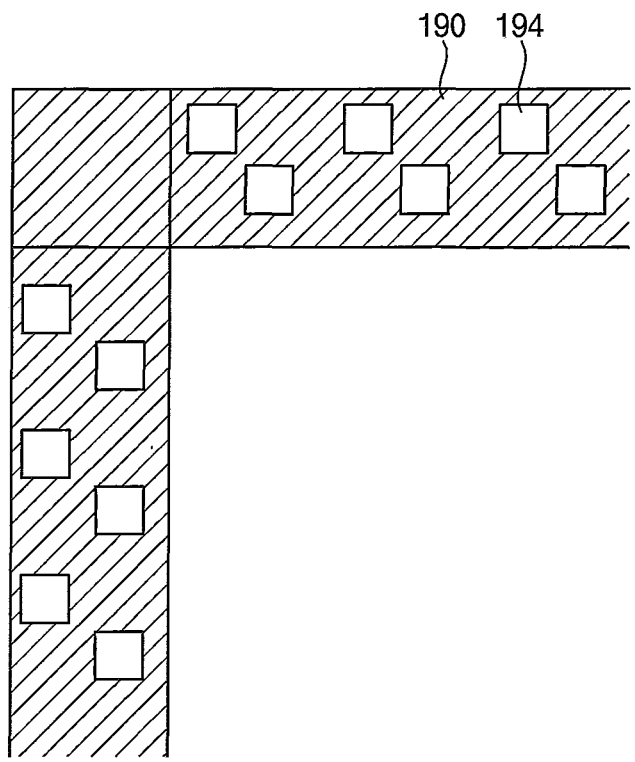
Figure 12:
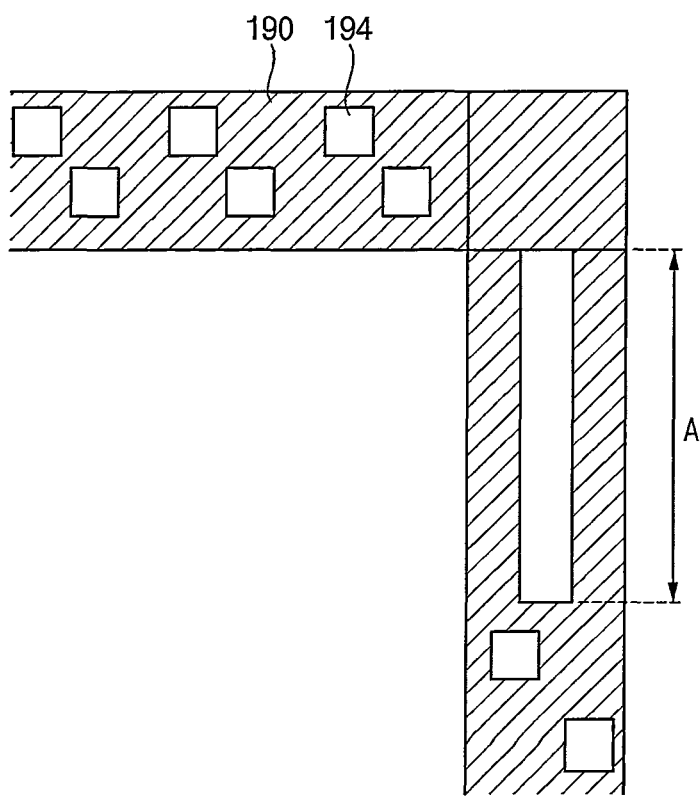

FIG. 4 is a plan view of a first upper wiring, and FIG. 5 is an enlarged plan view of a portion of the first upper wiring. FIG. 6 is a plan view of a second upper wiring, and FIG. 7 is an enlarged plan view of a portion of the second upper wiring. FIG. 8 is a plan view of a fourth upper wiring, and FIG. 9 is an enlarged plan view of a portion of the fourth upper wiring. FIG. 10 is a plan view of an uppermost wiring, and each of FIGS. 11 and 12 is an enlarged plan view of a portion of the fourth upper wiring.

Referring to FIGS. 2 and 3, the semiconductor device may include the lower structure 108 including the circuit patterns and the lower wirings 102, 104 and 106 on the substrate 100 and the upper structure 210 including a first upper wiring 200, a second upper wiring 202, a third upper wiring 204, a fourth upper wiring 206, an uppermost wiring 208, a first pad pattern 300, and a second pad pattern (290, referred to FIG. 1), each on the lower structure 108. Insulating interlayers 280 may be formed on the substrate 100 to cover the circuit patterns, detection lower wirings 102, 104 and 106, detection upper wirings 200, 202, 204, 206 and 208, and the pad patterns 300 and 290.

In the following description, the upper structure 210 may include the first to fourth upper wirings 200, 202, 204 and 206 and an uppermost wiring 208, but the number of upper wirings included in the upper structure 210 is not limited thereto. For example, the number of the upper wirings may be more or less than this.

A detection pad structure 400 may include the first pad pattern 300, and the uppermost wiring 208, the first to fourth upper wirings 200, 202, 204 and 206 and the lower wirings 102, 104 and 106 disposed under the lower surface of the first pad pattern 300 in a vertical direction. In the detection pad structure 400, the uppermost wiring 208, the first to fourth upper wirings 200, 202, 204 and 206 and the lower wirings 102, 104 and 106 may be electrically connected to the first pad pattern 300.

Although not shown, the uppermost wiring, the first to fourth upper wirings and the lower wirings electrically connected to the second pad pattern 290 may be disposed under the second pad pattern 290 serving as the actual electrical pad; however, example embodiments are not limited thereto.

When a surface of the second pad pattern 290 is contaminated by particles containing fluorine and/or the surface of the second pad pattern 290 is oxidized by oxygen such as by a native oxide, a resistance of the second pad pattern 290 may be increased. Thus, electrical signals may not be normally input and/or output through the second pad pattern 290, and electrical defects of the semiconductor device may occur. Therefore, a surface analysis of the second pad pattern 290 whether the second pad pattern 290 is normally formed may be required or desired. If the surface analysis is performed directly on the second pad pattern 290, damages of the second pad pattern 290 may occur. Therefore, in order to perform the surface analysis of the second pad pattern 290, the first pad pattern 300, which is not actually used as an electrical pad, may be provided. Alternatively or additionally, the surface analysis of the pad patterns 300 and 290 may be performed using the detection pad structure including the first pad pattern 300.

The uppermost wiring 208, the first to fourth upper wirings 200, 202, 204, and 206 and the lower wirings 102, 104, and 106 included in the detection pad structure 400 may be designed to have arrangements (and/or layout structures) suitable for the surface analysis of the pad patterns 300 and 290. Alternatively or additionally, the uppermost wiring 208, the first to fourth upper wirings 200, 202, 204, and 206 and the lower wirings 102, 104, and 106 included in the detection pad structure 400 may be designed to have arrangements (and/or layout structures) suitable for the cross-sectional structural analysis of the upper wirings 200, 202, 204, 206, and 208 of each layer in the semiconductor device. Cross-sectional structural analysis may include structural analysis using at least one of a scanning electron microscope (SEM) or a transmission electron microscopes (TEM); however, example embodiments are not limited thereto.

Therefore, in the plan views of each layer (or, each level), the uppermost wiring 208, the first to fourth upper wirings 200, 202, 204, and 206 and lower wirings 102, 104, and 106 included in the detection pad structure 400 may have arrangements different from arrangements of the uppermost wiring, the first to fourth upper wirings and lower wirings electrically connected to the second pad pattern 290, respectively.

In some example embodiments, the surface analysis of the detection pad structure 400 may be performed by an X-ray Photoelectron Spectroscopy (XPS) analysis method; however, example embodiments are not limited thereto. In a case of XPS, X-ray may be irradiated only to the surface of the first pad pattern 300, and thus the first pad pattern 300 and surface properties of the first pad pattern 300 may be analyzed. Nonetheless the x-rays may incidentally cause damage to neighboring structures. In order to perform the analysis of the first pad pattern 300 without or with minimizing damage to neighboring structures, the first pad pattern 300 may be may have a size of 50 μm or more in each of the first and second directions, e.g. may have an area of 2500 μm^2 or more. For example, the first pad pattern 300 may have a size of 50 μm to 120 μm in the each of or either of the first and second directions. However, since the surface analysis capability may vary depending on an XPS apparatus, the size of the first pad pattern 300 may be less than this. Therefore, the size of the first pad pattern 300 may not be limited thereto. The first pad pattern 300 and the second pad pattern 290 may have the same, or different, dimensions.

First, the detection pad structure 400 having arrangements suitable for the surface analysis of the pad pattern may be described.

The first pad pattern 300 may be electrically connected to the substrate 100 facing the first pad pattern 300 through the uppermost wiring 208, the first to fourth upper wirings 200, 202, 204, and 206, and the lower wirings 102, 104, and 106.

In some example embodiments, the lower wirings may include a lower contact 102, a lower pad pattern 104, and a metal via or contact 106. The lower contact 102 may be a lowermost contact electrically connected to the first pad pattern 300, and thus the lower contact 102 may directly contact the substrate 100. The metal contact 106 may be a contact plug directly connected to the first upper wiring 200.

In some example embodiments, the lower contact 102, the lower pad pattern 104, and the metal contact 106 included in the lower wirings may include, e.g., doped or undoped polysilicon and/or tungsten.

The circuit patterns (e.g., transistors and/or resistors and/or capacitors) may not be formed on the substrate 100 in which or over which the detection pad structure 400 is formed. Therefore, the lower contact 102 may not directly contact the circuit patterns. The lower contact 102 may contact the substrate 100, which may help support surface analysis of the top surface of the first pad pattern 300, for example in relation to charging effects associated with XPS analysis. The substrate 100 may or may not be grounded during XPS analysis.

When electrical signals are applied from the first pad pattern 300, the first pad pattern 300 may be directly and electrically connected to the substrate 100 through only the wirings and not through circuit patterns. In the XPS analysis, photoelectrons may be more easily applied on the surface of the substrate 100 for example when the first pad pattern 300 is connected to the substrate 100, and thus noises may be reduced during the XPS analysis.

In the detection pad structure 400, each of the first to fourth upper wirings 200, 202, 204, and 206 may include a metal pattern 120, 140, 160, and 180 and a via contact 130, 150, 170 and 184. In addition, the uppermost wiring 208 may include an uppermost metal pattern 190 and an uppermost contact 194.

In some example embodiments, the metal patterns 120, 140, 160 and via contacts 130, 150, 170 included in the first to third upper wirings 200, 202, and 204, and the metal pattern 180 included in the fourth wiring 206 may include copper, and a barrier metal layer may be formed on outer surfaces of the copper. The barrier metal layer may include, e.g., at least one of titanium, titanium nitride, tantalum, tantalum nitride, or the like.

In some example embodiments, the via contact 184 and the uppermost wiring 208 included in the fourth upper wirings 206 may include tungsten and/or aluminum.

Each of the metal patterns 120, 140, 160 and 180 included in the first to fourth upper wirings 200, 202, 204, and 206 may have a line shape extending in the first direction and/or second direction. The via contacts 130, 150, 170 and 184 may be disposed on the metal patterns 120, 140, 160 and 180, respectively.

Hereinafter, in a region between the substrate 100 and the first pad pattern 300 in the vertical direction, a portion facing under an edge of the first pad pattern 300 and having a rectangular shape or a rectangular ring shape in a plan view is referred to as an edge portion. In the region between the substrate 100 and the first pad pattern 300 in the vertical direction, a portion facing under a center of the first pad pattern 300 inside the edge portion is referred to as a center portion.

At the center portion of the detection pad structure 400, the metal patterns 120, 140, 160 and 180 included in the first to fourth upper wirings 200, 202, 204, and 206 may be linear/may have a line shape. In the first to fourth upper wirings 200, 202, 204, and 206, metal patterns adjacent to each other in the vertical direction may extend so as to cross a perpendicular direction to each other. For example, the metal patterns 120 and 160 included in the first and third upper wirings 200 and 204 may extend in the first direction, and the metal patterns 140 and 180 included in the second and fourth upper wirings 202 and 206 may extend in the second direction. The metal patterns 120, 140, 160 and 180 included in the first to fourth upper wirings 200, 202, 204, and 206 may extend to cross the perpendicular direction to each other, so that an upper wiring structure may be more stable. Further, defects of the upper wiring structure due to external physical impact may be decreased.

In some example embodiments, the metal patterns 120, 140, 160 and 180 included in the first to fourth upper wirings 200, 202, 204, and 206 may have a plurality of line widths. In addition, one or more via contacts 130, 150, 170, 184 may be disposed on each of the metal patterns 120, 140, 160, 180 in a width direction. In the first to fourth upper wirings 200, 202, 204, and 206, the metal patterns 120, 140, 160 and 180 and the via contacts 130, 150, 170 and 184 of each layer may be regularly and repeatedly arranged, e.g. may be arranged in a particular repeating pattern.

In some example embodiments, at least one of the first to fourth upper wirings 200, 202, 204, and 206 may be disposed to face an entire of the lower surface of the first pad pattern 300 in the vertical direction. For example, the metal patterns 120, 140, 160, and 180 of each layer included in the first to fourth upper wirings 200, 202, 204, and 206 may be disposed to face the entire of the lower surface of the first pad pattern 300 in the vertical direction.

As described above, the metal patterns 120, 140, 160 and 180 and the via contacts 130, 150, 170 and 184 of each layer may be regularly and repeatedly arranged. In the XPS structural analysis, the photoelectrons may be more easily applied from the detection pad structure 400 to the surface of the substrate 100 through the detection pad structure, so that noises may be reduced during the XPS analysis.

Even if a type of the semiconductor device and/or shapes of a semiconductor chip and a semiconductor package including the semiconductor device are different, the upper wirings included in the detection pad structure in the semiconductor device may be regularly and repeatedly arranged. In addition, some of the first to fourth upper wirings 200, 202, 204, and 206 may be disposed to face the entire of the lower surface of the first pad pattern 300 in the vertical direction. Therefore, when the XPS structural analysis is performed on the first pad pattern 300 in each of various semiconductor devices, noises generated from the detection pad structures 400 may not be significantly different, and may be almost constant. When the XPS structural analysis is performed, a difference between detection results due to the noises may be decreased, and thus a relative comparison of surface defects of the first pad pattern 300 in each of the various semiconductor devices having different types and/or different shapes may be more easily performed.

Hereinafter, the upper wirings 200, 202, 204, 206, and 208 included in the detection pad structure 400 having arrangements suitable for the cross-sectional structural analysis may be described.

For performing the cross-sectional structural analysis, the semiconductor device (for example, one or more packaged and/or unpackaged semiconductor chips and/or one or more semiconductor die within a wafer) may cut in the first direction or the second direction to obtain a sample for analysis. Patterns or contact plugs in the semiconductor device may be analyzed using the cross-sectional structure shown in a cut surface of the sample.

In general, the sample for analysis may be obtained by cut a portion for the cross-sectional structural analysis (e.g., analysis point) in the semiconductor device. Thus, when number of the analysis points in the semiconductor device may increase, the number of the samples for analysis (e.g., packaged or unpackaged semiconductor chips and/or semiconductor dies) may increase. Accordingly, many semiconductor chips and/or semiconductor dies may be consumed for the cross-sectional structural analysis, and thus cost for the cross-sectional structural analysis may be increased. When the number of the samples for analysis is increased, time required for the cross-sectional structural analysis and difficulty of the structural analysis may increase.

When the semiconductor device is cut in each of the first direction and the second direction, a cross-sectional structure shown in the cut surface of the sample may include all or most of the analysis points, in order to reduce the number of the samples for analysis.

In some example embodiments, when the cross-sectional structural analysis of the lower wirings 102, 104, and 106 is not required or to be performed, and the cross-sectional structural analysis of the upper wirings 200, 202, 204, 206, and 208 is only required or to be performed, a suitable detection pad structure may be presented. Accordingly, in the detection pad structure 400, the lower wirings 102, 104, and 106 may be freely disposed to be electrically connected to the upper wirings 200, 202, 204, 206, and 208. For example, ones of the metal contact 106 and the lower contact 102 included in the lower wirings 102, 104, and 106 may be aligned with a first via contact 130, a second via contact 150, and a third via contact 170 subsequently described in the vertical direction.

Hereinafter, arrangements of the upper wiring lines 200, 202, 204, 206, and 208 may be described in detail with reference to the plan views together.

Arrangements of the upper wirings 200, 202, 204, 206, and 208 positioned at the edge portion may be different from arrangements of the upper wirings 200, 202, 204, 206, and 208 positioned at the center portion. In the upper wirings 200, 202, 204, 206, and 208, wiring patterns positioned at the edge portions may be formed for analyzing lines or line widths of the metal patterns and spaces between the metal patterns of each layer. In each of the upper wirings 200, 202, 204, 206, and 208, wiring patterns positioned at the center portion may be formed for analyzing via contacts.

In some example embodiments, when the first pad pattern 300 has the size (e.g. a length of a side of) of 50 μm to 120 μm in each of the first direction and the second direction, a width of the edge portion may be about 1 μm to about 5 μm. However, the width of the edge portion may not be limited thereto. In some example embodiments, the width in the second direction of the edge portion extending in the first direction and the width in the first direction of the edge portion extending in the second direction may be substantially the same or different from each other. The width of the edge portion may be determined so that the metal patterns 120, 140, 160, and 180 of each layer may be arranged to have a minimum line width and a minimum space (e.g., a design rule).

The first upper wiring 200 may be formed on the metal contact 106 and the insulating interlayer. The first upper wiring 200 may include a first metal pattern 120 and a first via contact 130 on the first metal pattern 120.

The first metal pattern 120 may have a line shape extending in the first direction while contacting an upper surface of the metal contact 106. The first via contact 130 may contact the first metal pattern 120 and a second metal pattern 140 included in the second upper wiring 202, and thus the first metal pattern 120 may be electrically connected to the second metal pattern 140.

In the plan views, arrangements of the first metal patterns 120 and the first via contact 130 may be described with reference to FIGS. 2 and 3 and FIGS. 4 and 5 together.

The first upper wiring 200 may include a first A detection pattern 122*a* disposed at the edge portion having the rectangular ring shape and a first B detection pattern 122*b* disposed at the center portion.

In some example embodiments, the first A detection pattern 122*a* may have an arrangement suitable for a structural analysis of first metal patterns (hereinafter, actual first metal patterns) having various sizes and shapes used in the semiconductor device. For example, the first A detection pattern 122*a* may be or correspond to patterns representing the actual first metal patterns, so that the line widths and/or the arrangement of the actual first metal patterns included in the semiconductor device may be more accurately analyzed by analyzing the first A detection pattern 122*a*.

In some example embodiments, the first A detection pattern 122*a* may include a first line pattern 120*a*1, a second line pattern 120*a*2, and a first island pattern 120*a*3. The first line pattern 120*a*1 may be disposed at the edge portion extending in the first direction, and the first line pattern 120*a*1 may extend in the first direction. The second line pattern 120*a*2 may be disposed at the edge portion extending in the second direction, and the second line pattern 120*a*2 may extend in the second direction. The first island pattern 120*a*3 may be disposed at each vertex of the edge region (e.g. each corner), and the first island pattern 120*a*3 may connect ends of the first line patterns 120*a*1 and the second line patterns 120*a*2. The first island pattern 120*a*3 may have a rectangular shape, e.g. may have a square shape; however, example embodiments are not limited thereto.

The first line patterns 120*a*1 and the second line patterns 120*a*2 may be electrically connected to each other by the first island pattern 120*a*3. In some example embodiments, the first via contacts 130 for electric connection of upper and lower wirings may be formed on the first island pattern 120*a*3.

In addition, the first A detection pattern 122*a* and the first B detection pattern 122*b* may be electrically connected to each other by the first island pattern 120*a*3. As the first A detection pattern 122*a* and the first B detection patterns 122*b* are electrically connected, photoelectrons may be stored in a specific region and/or may more easily escape during the XPS analysis.

In some example embodiments, the first A detection pattern 122*a* may be provided to analyze whether the line width of the actual first metal pattern and the space between the actual first metal patterns are normal, e.g. are within design expectations. The actual first metal patterns may extend in the first direction. Therefore, the actual first metal patterns may be analyzed using the first line patterns 120*a*1 extending in the first direction. Accordingly, at least one of the first line patterns 120*a*1 may be disposed to have a minimum line width of the actual first metal patterns and a minimum space (e.g., design rule) between the actual first metal patterns in the semiconductor device. As the actual first via contact is not analyzed using the first A detection pattern 122*a*, the first via contact may not be formed on the first and second line patterns 120*a*1 and 120*a*2.

In some example embodiments, the first B detection pattern 122*b* may be provided for a structural analysis of the first via contacts (hereinafter, actual first via contacts) having various arrangements in the semiconductor device. In some example embodiments, the first metal pattern and the first via contacts included in the first B detection pattern 122*b* may be disposed over an entire plane of, e.g. may be contiguous over, the center portion, and the first metal pattern and the first via contacts may be regularly and repeatedly arranged.

The first B detection pattern 122*b* may include third line patterns 120*b* and first via contacts 130 on the third line patterns 120*b*. The first via contacts 130 included in the first B detection pattern 122*b* may have a shape and/or an arrangement the same as those of the actual first via contacts in or within the semiconductor device.

The third line patterns 120*b* may extend in an extension direction of the actual first metal pattern. Thus, the third line patterns 120*b* may extend in the first direction. The third line patterns 120*b* may have various line widths in the second direction according to the number of first via contacts 130 disposed on each of the third line patterns 120*b*.

In some example embodiments, an upper surface of each of the first via contacts 130 may have an elliptical shape including a short axis and a long axis. For example, in the plan views, each of via contacts is simply shown as a rectangle shape, but the upper surface of each of the via contacts formed by finally semiconductor process may have the elliptical shape.

In some example embodiments, an upper surface of each of the first via contacts may have a circular shape. For example, in a plan view, when the via contact is shown to have a square shape, the upper surface of the via contact formed by finally semiconductor process may have a circular shape.

In the first B detection pattern 122*b*, one or more first via contacts 130 may be disposed within a line width of a line pattern therebelow (e.g., the third line pattern 120*b*).

For example, the first B detection pattern 122*b* may include a first pattern structure 132*a* in which the plurality of first via contacts 130 are arranged in the second direction on one third line pattern 120*b*1. The first pattern structure 132*a* may be referred to as a multi via structure.

The first via contacts 130 in the first pattern structure 132*a* may be disposed such that a width in the second direction is a short axis. In some example embodiments, the number of the first via contacts 130 arranged in the second direction in the first pattern structure 132*a* may be the same as a maximum number or a design rule number of actual first via contacts arranged in second directions on the actual first metal pattern in the semiconductor device.

Referring to FIGS. 4 and 5, the first pattern structure 132*a* may include, for example, five first via contacts 130 arranged in the second direction on one third line pattern 120*b*1, but the number of the first via contacts 130 arranged in the second direction on one pattern structure 132*a* may not be limited thereto.

For example, the first B detection pattern 122b may further include a second pattern structure 132b in which one first via contact 130 is arranged in the second direction on one third line pattern 120b2. In this case, the first via contact 130 in the second pattern structure 132b may be disposed such that a width in the second direction is a short axis. For example, in the second pattern structure 132b, a width in the second direction of the first via contact 130 may be less than a width in the first direction of the first via contact 130. The second pattern structure 132b may be referred to as a short single via structure.

For example, the first B detection pattern 122b may further include a third pattern structure 132c in which one first via contact 130 is arranged in the second direction on one third line pattern 120b3. The first via contact 130 in the third pattern structure 132c may be disposed such that a width in the second direction of the first via contact 130 is a long axis. For example, in the third pattern structure 132c, a width in the second direction of the first via contact 130 may be greater than a width in the first direction of the first via contact 130. The third pattern structure 132c may be referred to as a long single via structure.

The first pattern structure 132a, the second pattern structure 132b, and the third pattern structure 132c may be regularly and repeatedly disposed at the center portion. For example, a set including the first pattern structure 132a, the second pattern structure 132b, and the third pattern structure 132c sequentially arranged may be symmetrically disposed. For example, the first, second, and third pattern structures and the third, second, and first pattern structures may be sequentially and repeatedly arranged in the second direction. As another example, the first pattern structure 132a, the second pattern structure 132b and the third pattern structure 132c may be sequentially and repeatedly arranged in the second direction.

In some example embodiments, an end in the first direction of the third line pattern 120b included in the first B detection pattern 122b may contact the second line pattern 120a2. Thus, the first A detection pattern 122a and the first B detection pattern 122b may be electrically connected to each other.

The second upper wiring 202 may include a second metal pattern 140 and a second via contact 150 on the second metal pattern 140.

The second metal pattern 140 may have a line shape extending in the second direction while contacting upper surfaces of the first via contacts 130. The second via contact 150 may contact the second metal pattern 140 and a third metal pattern 160 included in the third upper wiring, so that the second metal pattern 140 and the third metal pattern 160 may be electrically connected to each other.

In the plan views, arrangements of the second metal patterns 140 and the second via contact 150 may be described with reference to FIGS. 2 and 3 and FIGS. 6 and 7 together.

The second upper wiring 202 may include a second A detection pattern 142a disposed at the edge portion having the rectangular ring shape and a second B detection pattern 142b disposed at the center portion.

In some example embodiments, the second A detection pattern 142a may be an arrangement suitable for or appropriate for or configured for a structural analysis of second metal patterns (or, actual second metal patterns) having various sizes and shapes in the semiconductor device.

In some example embodiments, the second A detection pattern 142a may include a fourth line pattern 140a1, a fifth line pattern 140a2, and a second island pattern 140a3. The fourth line pattern 140a1 may be disposed at the edge portion extending in the first direction, and the fourth line pattern 140a1 may extend in the first direction. The fifth line pattern 140a2 may be disposed at the edge portion extending in the second direction, and the fifth line pattern 140a2 may extend in the second direction. The second island pattern 140a3 may be disposed at each vertex of the edge portion, and the second island pattern 140a3 may connect ends of the fourth line patterns 140a1 and the fifth line patterns 140a2. In some example embodiments, the second via contacts 150 may be formed on the second island pattern 140a3. A shape of the second island pattern 140a3 may be similar to a shape of the first island pattern 120a3.

In some example embodiments, the second A detection pattern 142a may be provided to analyze whether the line width of the actual second metal pattern and the space between the actual second metal patterns are normal, e.g. are within design expectations. The actual second metal patterns may extend in the second direction. Therefore, actual second metal patterns may be analyzed using the fifth line patterns 140a2 extending in the second direction. Accordingly, at least one of the fifth line patterns 140a2 may be disposed to have a minimum line width of the actual second metal patterns and a minimum space between the actual second metal patterns in the semiconductor device. As the actual second via contact is not analyzed or structurally analyzed using the second A detection pattern 142a, the second via contact may not be formed on the fourth and fifth line patterns 140a1 and 140a2.

In some example embodiments, the second B detection pattern 142b may be provided for a structural analysis of the second via contacts (or, actual second via contacts) having various arrangements in the semiconductor device. In some example embodiments, the second metal pattern and the second via contacts included in the second B detection pattern 142b may be disposed over an entire plane of the center portion, and the second metal pattern and the second via contacts may be regularly and repeatedly arranged.

The second B detection pattern 142b may include sixth line patterns 140b and second via contacts 150 on the sixth line patterns 140b. The second via contacts 150 included in the second B detection pattern 142b may have a shape and/or an arrangement the same as those of the actual second via contacts in the semiconductor device.

The sixth line patterns 140b may extend in an extension direction of the actual second metal pattern. Thus, the sixth line patterns 140b may extend in the second direction. The sixth line patterns 140b may have various line widths in the first direction according to the number of second via contacts 150 disposed on each of the sixth line patterns 140b.

In some example embodiments, an upper surface of each of the second via contacts 150 may have a rectangular shape and/or an elliptical shape including a short axis and a long axis. In some example embodiments, the upper surface of each of the second via contacts may have a square shape and/or a circular shape.

In the second B detection pattern 142b, one or more second via contacts 150 may be disposed within the line width of a line pattern therebelow (e.g., the sixth line pattern 140b).

For example, the second B detection pattern 142b may include a fourth pattern structure 152a in which a plurality of second via contacts 150 are arranged in the first direction on one sixth line pattern 140b1.

The fourth pattern structure 152a may be a multi-via structure. The second via contacts 150 in the fourth pattern structure 152a may be disposed such that a width in the first direction is a short axis. For example, the number of the second via contacts 150 arranged in the first direction in the fourth pattern structure 152a may be the same as a maximum number of or design-rule number of actual second via contacts arranged in the first direction on the actual second metal pattern in the semiconductor device.

Referring to FIGS. 6 and 7, the fourth pattern structure 152a may include five second via contacts, but the number of the second via contacts 150 in the fourth pattern structure 152a may not be limited thereto.

For example, the second B detection pattern 142b may further include a fifth pattern structure 152b in which one second via contact 150 is arranged on one sixth line pattern 140b2. The second via contact 150 in the fifth pattern structure 152b may be disposed such that a width in the first direction is a short axis. The fifth pattern structure 152b may be the short single via structure.

For example, the second B detection pattern 142b may further include a sixth pattern structure 152c in which one second via contact 150 is arranged on one sixth line pattern 140b3. The second via contact 150 in the sixth pattern structure 152c may be disposed such that a width in the first direction is a long axis. The sixth pattern structure 152c may be the long single via structure.

In some example embodiments, an end in the second direction of the sixth line pattern 140b included in the second B detection pattern 142b may contact the fourth line pattern 140a1. Thus, the second A detection pattern 142a and the second B detection pattern 142b may be electrically connected to each other.

The fourth pattern structure 152a, the fifth pattern structure 152b, and the sixth pattern structure 152c may be regularly and repeatedly disposed in the center portion. For example, a set including or consisting of the fourth pattern structure 152a, the fifth pattern structure 152b, and the sixth pattern structure 152c sequentially arranged may be symmetrically disposed. For example, the fourth, fifth and sixth structures and the sixth, fifth, and fourth pattern structures may be sequentially and repeatedly arranged in the first direction. For another example, the fourth pattern structure 152a, the fifth pattern structure and the sixth pattern structure 152c may be sequentially and repeatedly arranged in the first direction.

The third upper wiring 204 may include a third metal pattern 160 and a third via contact 170 on the third metal pattern 160.

The third metal pattern 160 may have a line shape extending in the first direction while contacting upper surfaces of the second via contacts 150. The third via contact 170 may contact the third metal pattern 160 and a fourth metal pattern 180 included in the fourth upper wiring 206, so that the third metal pattern 160 and the fourth metal pattern 180 may be electrically connected to each other.

Arrangements of the third metal pattern 160 and the third via contact 170 may be similar to the arrangements of the first metal pattern 120 and the first via contact 130, respectively. For example, the arrangements of the third metal pattern 160 and the third via contact 170 may be substantially the same as or similar to those illustrated in FIGS. 4 and 5.

The third upper wiring 204 may include a third A detection pattern disposed at the edge portion having the rectangular ring shape and a third B detection pattern disposed at the center portion.

In some example embodiments, the third A detection pattern may have an arrangement structure suitable for structural analysis of third metal patterns (or, actual third metal patterns) having various sizes and shapes in the semiconductor device.

In some example embodiments, the third A detection pattern may include a seventh line pattern extending in the first direction, an eighth line pattern extending in the second direction, and a third island pattern. The third island pattern may be disposed at each vertex of the edge portion.

In some example embodiments, the third A detection pattern is provided to analyze whether the line width of the actual third metal pattern and the space between the actual third metal patterns are normal. The actual third metal pattern may extend in the first direction. Therefore, the actual third metal pattern may be analyzed using the seventh line patterns extending in the first direction. Accordingly, at least one of the seventh line patterns may be disposed to have a minimum line width of the actual third metal patterns and a minimum space between the actual third metal patterns in the semiconductor device. The third via contact may not be formed on the seventh and eighth line patterns. In some example embodiments, the third island pattern may have a shape similar to a shape of one of the first and second island patterns. In some example embodiments, the third via contacts 170 may be formed on the third island pattern, and the third via contacts 170 may serve as an electric connection member between upper wirings and lower wirings.

In some example embodiments, the third B detection pattern may be provided for a structural analysis of third via contacts (or, actual third via contacts) having various arrangements in the semiconductor device. In some example embodiments, the third metal pattern and the third via contacts included in the third B detection pattern may be disposed over an entire plane of the center portion, and the third metal pattern and the third via contacts may be regularly and repeatedly arranged.

The third B detection pattern may be provided to analyze whether the actual third via contacts formed on the third metal pattern 160 have a normal structure. Thus, the third B detection pattern may include ninth line patterns extending in the first direction and third via contacts 170 on the ninth line patterns. The third via contacts 170 included in the third B detection pattern may have a shape and an arrangement the same as those of the actual third via contacts in the semiconductor device.

In the third B detection pattern, one or more third via contacts 170 may be disposed on a line pattern therebelow (e.g., the ninth line pattern). The ninth line patterns may have various line widths in the second direction according to the number of the third via contacts 170 disposed on each of the ninth line pattern.

In some example embodiments, the ninth line patterns included in the third B detection pattern may be disposed to overlap each other in the vertical direction with the third line patterns 120b included in the first B detection pattern 122a. In some example embodiments, some of the third via contacts 170 included in the third B detection pattern may be disposed to overlap (or, align) each other in the vertical direction with the first via contacts 130 included in the first B detection pattern.

As shown in FIG. 2, in a cross-section of the detection pad structure 400 cut in the second direction, the first line pattern 120a1 and the third line pattern 120b, the seventh line pattern, the ninth line pattern, the first via contact 130 and the third via contact corresponding to measurement points of the semiconductor device may be presented.

For example, the third B detection pattern may include a seventh pattern structure having the multi-via structure. In some example embodiments, the seventh pattern structure may be disposed to overlap each other in the vertical direction with the first pattern structure 132*a*.

For example, the third B detection pattern may further include an eighth pattern structure having the short single via structure. In some example embodiments, the eighth pattern structure may be disposed to overlap each other in the vertical direction with the second pattern structure 132*b*.

For example, the third B detection pattern may further include a ninth pattern structure having the long single via structure. In some example embodiments, the ninth pattern structure may be disposed to overlap each other in the vertical direction with the third pattern structure 132*c*.

The seventh pattern structure, the eighth pattern structure, and the ninth pattern structure may be regularly and repeatedly arranged. For example, an arrangement of the third B detection pattern may be similar to the arrangement of the first B detection pattern.

An upper wiring (e.g., the fourth upper wiring) may be formed directly below the uppermost wiring, and may be electrically connected to the uppermost wiring. The upper wiring may have a structure slightly different from structures of wirings below the upper wiring.

The fourth upper wiring 206 may include a fourth metal pattern 180 and a fourth via contact 184 on the fourth metal pattern 180.

The fourth metal pattern 180 may have a line shape extending in the second direction while contacting upper surfaces of the third via contacts 170. The fourth via contact 184 may be disposed only at the edge portion having the rectangular ring shape.

In the plan views, arrangements of the fourth metal patterns 180 and the fourth via contact 184 may be described with reference to FIGS. 8 and 9 together.

The fourth metal pattern 180 may include a fourth A detection pattern 182*a* at the edge portion having the rectangular ring shape and a fourth B detection pattern 182*b* disposed at the center portion.

In some example embodiments, the fourth A detection pattern 182*a* may be an arrangement suitable for a structural analysis of fourth metal patterns (or, actual fourth metal patterns) and fourth via contacts (or, actual fourth via contacts) having various sizes and shapes in the semiconductor device.

The fourth B detection pattern 182*b* may not be used for structural analysis of the actual fourth metal patterns and the actual fourth via contacts. However, the fourth B detection pattern 182*b* may be formed for connection with wirings under the fourth B detection pattern. In some example embodiments, the fourth metal patterns 180 included in the fourth B detection pattern 182*b* may be disposed over an entire plane of the center portion, and the fourth metal patterns 180 may be regularly and repeatedly arranged.

In some example embodiments, the fourth A detection pattern 182*a* may include a tenth line pattern 180*a*1 extending in the first direction, an eleventh line pattern 180*a*2 extending in the second direction, a fourth island pattern 180*a*3 and fourth via contacts 184. The fourth via contacts 184 may be formed on the tenth line pattern 180*a*1, the eleventh line pattern 180*a*2, and the fourth island pattern 180*a*3.

In some example embodiments, the actual fourth metal patterns may extend in the second direction. Therefore, the actual fourth metal patterns may be analyzed using the eleventh line pattern 180*a*2 extending in the second direction. In some example embodiments, when the actual fourth metal patterns extend in the first direction, the actual fourth metal patterns may be analyzed using the tenth line pattern 180*a*1 extending in the first direction.

In some example embodiments, at least one of the eleventh line patterns 180*a*2 may be disposed to have a minimum line width of the actual fourth metal patterns and a minimum space between the actual fourth metal patterns in the semiconductor device. At least one of the eleventh line patterns 180*a*2 may have a width greater than the minimum line width of the actual fourth metal patterns, so that the fourth via contacts 184 may be disposed on the eleventh line patterns 180*a*2.

In some example embodiments, at least one of the tenth line patterns 180*a*1 may be disposed to have a minimum line width of the actual fourth metal patterns and a minimum space between the actual fourth metal patterns in the semiconductor device. At least one of the tenth line patterns 180*a*1 may have a width greater than the minimum line width of the actual fourth metal patterns, so that the fourth via contacts 184 may be disposed on the tenth line patterns 180*a*1.

The fourth via contacts 184 included in the fourth A detection pattern 182*a* may have shapes and arrangements the same as those of the actual fourth via contacts in the semiconductor device.

The fourth B detection pattern 182*b* may include only twelfth line patterns 180*b*. That is, the fourth via contacts may not be formed on the twelfth line patterns 180*b*. The twelfth line patterns 180*b* may serve as an electrical connection member with the third via contact 170 therebelow. Ends in the second direction of the twelfth line patterns 180*b* may contact the tenth line patterns 180*a*1. Thus, the fourth A detection pattern 182*a* and the fourth B detection pattern 182*b* may be electrically connected to each other.

In some example embodiments, the twelfth line patterns 180*b* may be disposed to overlap each other in the vertical direction with the sixth line patterns 140*b* included in the second B detection pattern 142*b*. The twelfth line patterns 180*b* may be regularly and repeatedly arranged, so that noises during the XPS analysis may be decreased. Further, a deviation of the noises may be decreased.

As shown in FIG. 3, in a cross-section of the detection pad structure 400 cut in the first direction, the fifth line pattern 140*a*2, the sixth line pattern 140*b*, the eleventh line pattern 180*a*2, the second via contact 150, and the fourth via contact 184 corresponding to the measurement points of the semiconductor device may be presented.

The uppermost wiring 208 may have a structure slightly different from structures of wirings below the uppermost wiring 208. The uppermost wiring 208 may include an uppermost metal pattern 190 and an uppermost contact 194.

The uppermost metal pattern 190 may be disposed only at the edge portion having the rectangular ring shape. Via contacts contacting each of upper surface and lower surfaces of the uppermost metal pattern 190 may be disposed only at the edge portion. That is, the uppermost contact 194 may be disposed only at the edge portion.

In the plan views, arrangements of the uppermost metal patterns and the uppermost contacts may be described with reference to FIGS. 1 and 2 and FIGS. 10, 11 and 12 together.

Patterns and contacts may not be disposed at the center portion over the fourth B detection pattern 182*b*. That is, an insulating interlayer 280 may be formed on the fourth B detection pattern 182*b* to cover the fourth B detection pattern 182*b*.

In some example embodiments, a portion of the uppermost metal pattern 190 may have a line width and a space of a design rule the same as a design rule of uppermost metal patterns (or, actual uppermost metal patterns) in the semiconductor device. For example, the uppermost metal pattern 190 may have the rectangular ring shape including removing portion so as to partially cover the edge portion, so that a portion of the uppermost metal pattern 190 may have the design rule of the actual uppermost metal pattern.

In some example embodiments, when the actual uppermost metal pattern has a line shape extending in the second direction, the uppermost metal pattern 190 disposed at a partial portion extending in the second direction (or, referred to as a first region, A) may only have the design rule of the actual uppermost metal pattern. In some example embodiments, the first region A may have a length in the second direction of about 5 µm to about 15 µm. However, the length of the first region A may not be limited thereto. A remaining region beside the first region A is referred to as a second region. For example, as shown in FIG. 12, the first region A may be positioned at the partial portion extending in the second direction. The uppermost contacts may not be formed on the uppermost metal pattern 190 in the first region A.

An uppermost contact 194 may be formed on the uppermost metal pattern 190 in the second region B. The uppermost contacts 194 may have shapes and arrangements the same as those of actual uppermost contacts in the semiconductor device.

In some example embodiments, when the actual uppermost metal pattern has a line shape extending in the first direction, the uppermost metal pattern 190 disposed at a partial portion extending in the first direction may only have a design rule of the actual uppermost metal pattern. The partial portion extending in the first direction may serve as the first region A.

The uppermost metal pattern 190 may have a sufficient width so that the uppermost contact 194 may be disposed on the uppermost metal pattern 190. In some example embodiments, the uppermost metal pattern 190 may have a wide width so as to completely cover the second region B of the edge portion.

In a cross-section of the detection pad structure 400 cut in the first direction to include the first and second regions, the fifth line pattern 140a2, the sixth line pattern 140b, the eleventh line pattern 180a2, the second via contact 150 and the fourth via contact 184 corresponding to the measurement points, as well as the uppermost metal pattern 190 and the uppermost contact 194 may be presented together. Thus, as shown in FIG. 3, the structural analysis of the second upper wiring 202, the fourth upper wiring 206 and the uppermost wiring 208 corresponding to the measurement points may be performed by using one sample including the cross-section of the detection pad structure 400 cut in the first direction.

In a cross-section of the detection pad structure 400 cut in the second direction, the first line pattern 120a1, the third line pattern 120b, the seventh line pattern, the ninth line pattern and the first via contact 130 and the third via contact 170 corresponding to measurement points, as well as the uppermost metal pattern 190 and the uppermost contact 194 may be presented together. Thus, as shown in FIG. 2, the structural analysis of the first upper wiring 200, the third upper wiring 204, and the uppermost wiring 208 corresponding to the measurement points may be performed by using one sample including the cross-section of the detection pad structure 400 cut in the second direction.

The first pad pattern 300 may be formed on the uppermost contact 194 and the insulating interlayer 280 between the uppermost contacts 194. In the detection pad structure 400, the first pad pattern 300 may have a rectangular shape covering the uppermost contact 194 and the insulating interlayer 280. When a metal pattern is formed directly below the first pad pattern 300 in the center portion, the metal pattern may be damaged by a probing needle for analysis. Therefore, the metal pattern may not be formed directly below the first pad pattern 300 in the center portion, and the insulating interlayer 280 may be formed directly below the first pad pattern 300 in the center portion.

In the detection pad structure, upper wirings of each layer disposed at the edge portion may be arranged to have the design rule of actual wirings of each layer. In the detection pad structure, via contacts of the upper wirings of each layer may have the arrangement the same as the arrangement of the actual via contacts of each layer. In the detection pad structure, ones of the via contacts of the upper wirings of each layer may be aligned to each other in the vertical direction. In the detection pad structure, the first pad pattern may be directly electrically connected to the substrate through the upper wirings and the lower wirings.

The surface of the pad pattern and the structure of the upper wiring may be more accurately analyzed by using the detection pad structure, and the number of samples for analysis such as structural analysis may be reduced.

Figure 13:
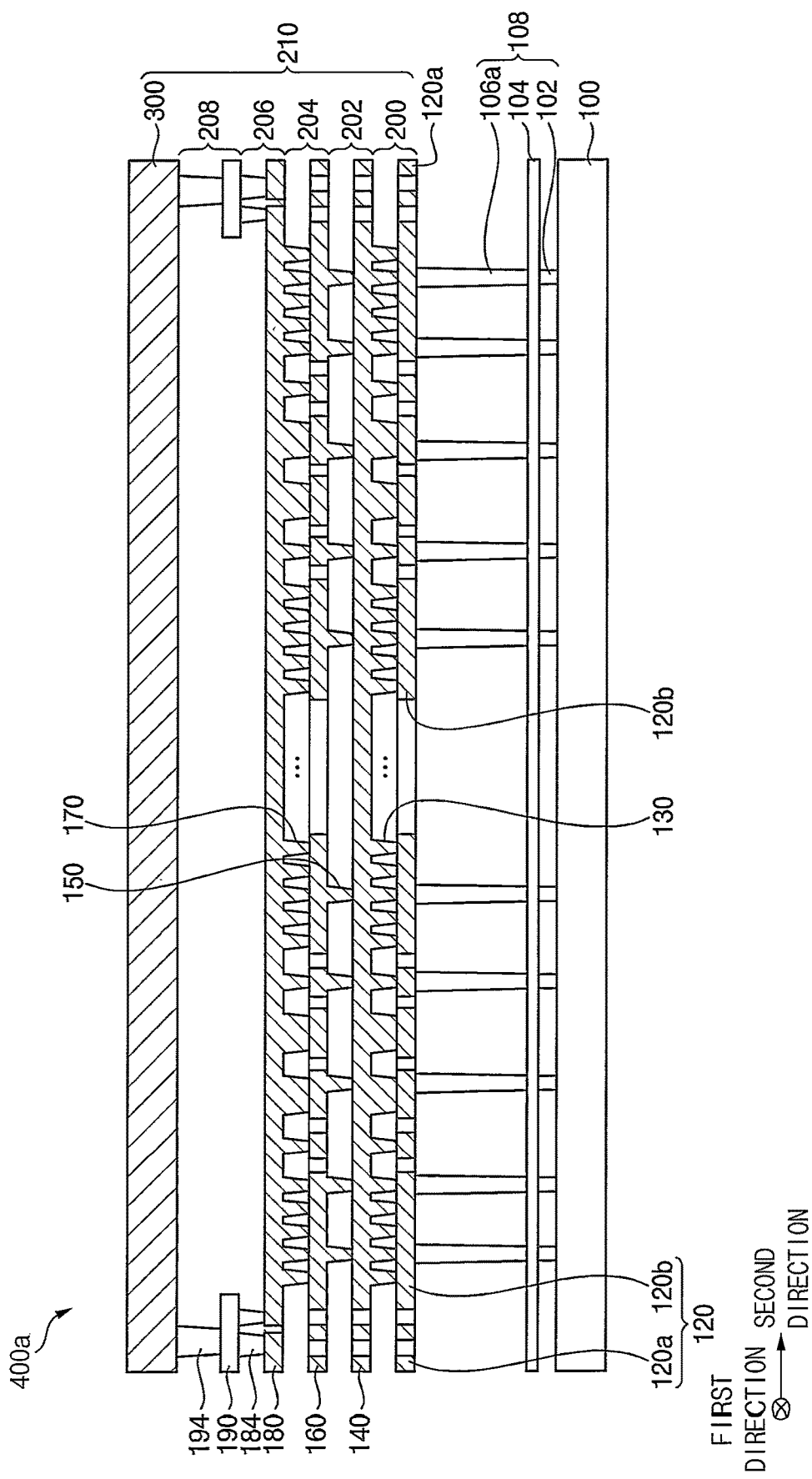
Figure 14:
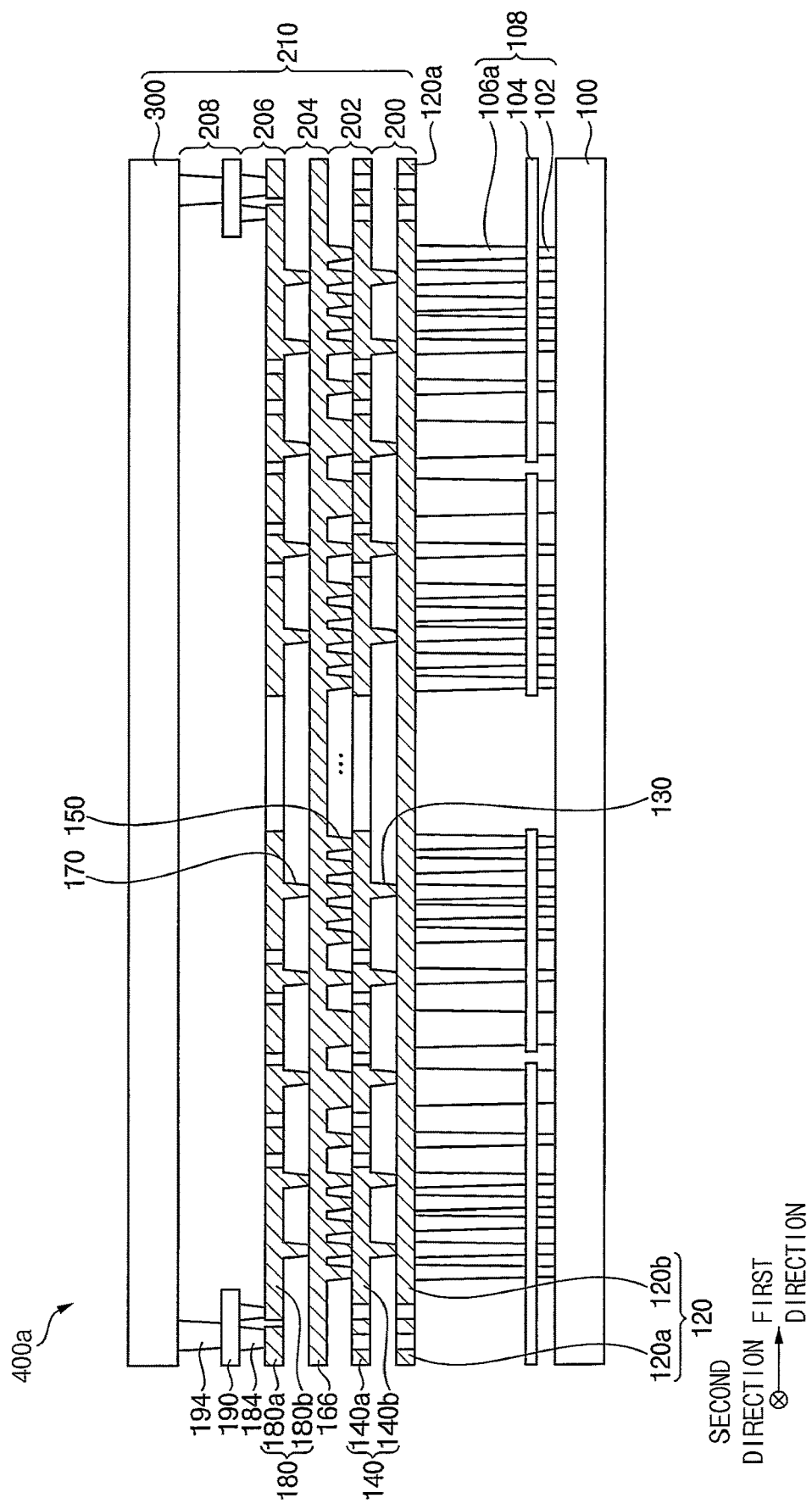

FIG. 13 is a cross-sectional view of a detection pad structure in accordance with example embodiments cut in the second direction. FIG. 14 is a cross-sectional view of a detection pad structure in accordance with some example embodiments cut in the first direction.

The detection pad structure 400a described with reference to FIGS. 13 and 14 may have a suitable arrangement for analyzing a cross-sectional structure of the metal contact 106a of the lower wiring and the upper wirings 200, 202, 204, 206, and 208.

The detection pad structure may be substantially the same as the detection pad structure described with reference to FIGS. 2 to 12, except for the arrangement of the lower wiring. That is, the upper wiring of the detection pad structure may be substantially the same as the upper wiring of the detection pad structure described with reference to FIGS. 2 to 12.

Referring to FIGS. 13 and 14, in the detection pad structure 400a, the lower wirings 102, 104, and 106a may include a lower contact 102 contacting on the substrate 100, a lower pad pattern 104 and metal contact 106a. The number of stacked the contacts and the lower patterns included in the lower wiring may not be limited thereto.

As a structural analysis of the metal contacts 106a in the lower wirings may be performed by using the detection pad structure 400a, the metal contacts 106a may be formed to have the same shape and the arrangement as the actual metal contacts in the semiconductor device. The metal contacts 106a may be regularly and repeatedly arranged.

In some example embodiments, the metal contacts 106a may be aligned with the first via contact 130, the second via contact 150, and the third via contact 170 disposed thereon in the vertical direction. Thus, in each cross section of the detection pad structure 400a cut in the first and second directions, the metal contacts 106a and upper wirings 200, 202, 204, and 206 corresponding to the measurement points may be presented. Therefore, the structures of the metal contacts 106a and upper wirings 200, 202, 204, and 206 corresponding to the measurement points may be analyzed by using a sample including the cross section cut in the first direction and a sample including the cross section cut in the second direction.

In some example embodiments, a structural analysis of each of the lower pad patterns 104 and the lower contacts 102 may not be performed using the detection pad structure. Therefore, the lower pad pattern 104 and the lower contact 102 may be freely disposed to be electrically connected to the metal contact 106a. For example, the lower contact 102 may be aligned with the metal contacts 106a in the vertical direction. Further, the lower pad pattern 104 may have no line shape.

When the shape and the arrangement of the via contacts included in the actual upper wiring in the semiconductor device are diversified, layouts of the plan view of the upper wiring of each layer in the detection pad structure may be changed according to the shape and the arrangement of the via contacts.

Figure 15:
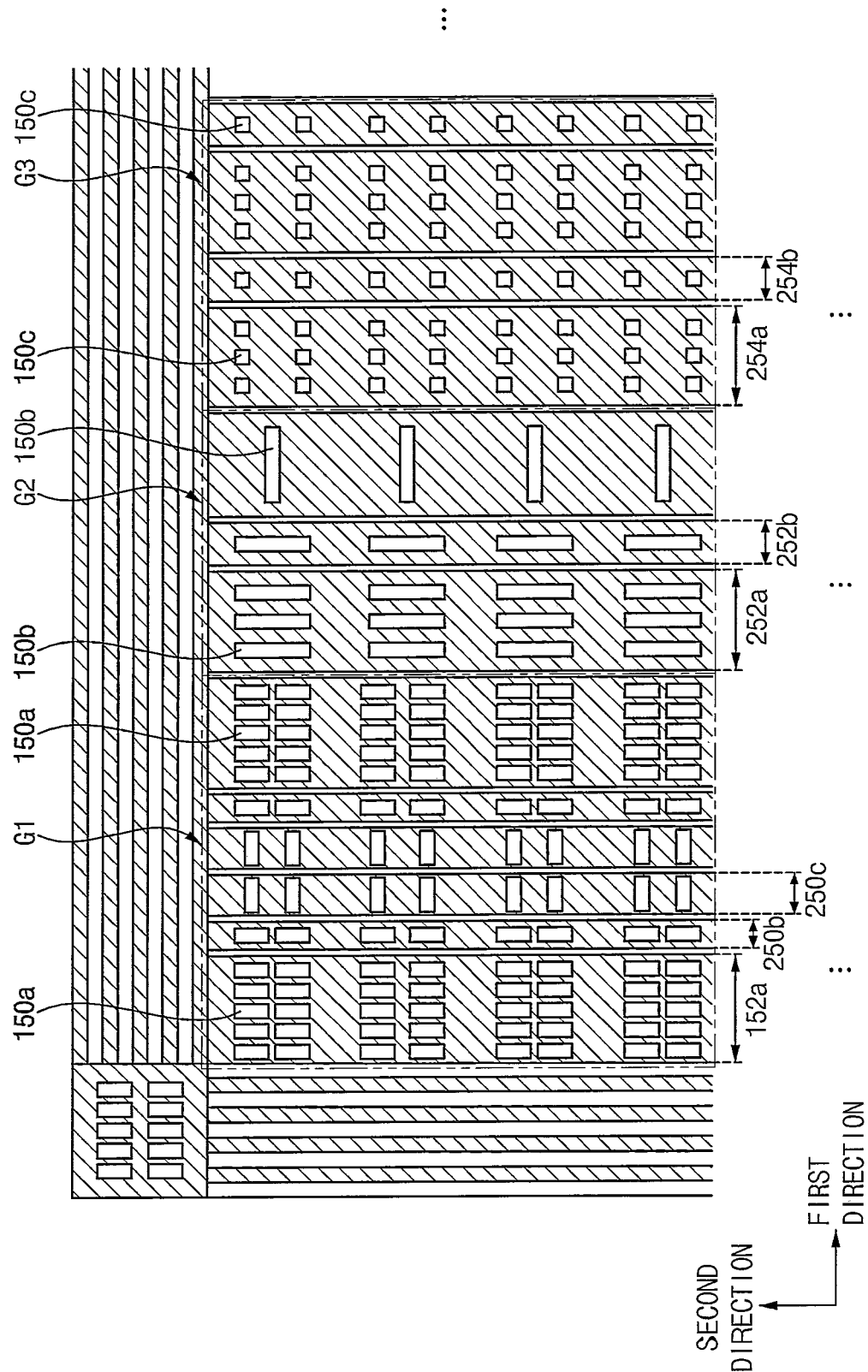

FIG. 15 is a plan view of one of via contacts and metal contacts in the detection pad structure in accordance with some example embodiments.

FIG. 15 is an enlarged view of a portion of the detection pad structure.

An upper wiring including the metal pattern extending in the first direction may be described with reference to FIG. 15. Particularly, the arrangement of the line pattern and the second via contact in the second upper wiring disposed at the center portion may be described. However, in the upper wirings of other layers, line patterns and via contacts may be grouped depending on shapes in the same manner, and thus the line patterns and via contacts may be regularly and repeatedly arranged. Further, in metal contacts under the upper wirings, the metal contacts may be grouped depending on shapes in the same manner, and thus the metal contacts may be regularly and repeatedly arranged.

Referring to FIG. 15, the detection pad structure may include a plurality of second via contacts 150a, 150b, and 150c having different shapes of upper surfaces. For example, the detection pad structure may include three types of second via contacts 150a, 150b, and 150c having different upper surfaces. The second via contact may include an elliptical via contact having a first size (hereinafter, referred to as a second A via contact, 150a), an elliptical via contact having a second size (hereinafter, referred to as a second B via contact, 150b), and a circular via contact (hereinafter referred to as a second C via contact, 150c). The first size and the second size may be different from each other, and first size may be greater than the second size.

A first contact group G1 in which the second A via contacts 150a are formed, a second contact group G2 in which the second B via contacts 150b are formed, and third contact group G3 in which the second C via contacts 150c is formed may be regularly and repeatedly arranged at the center portion. For example, a set of the first contact group G1, the second contact group G2, and the third contact group G3 may be symmetrically disposed. In other words, the first group, the second group, the third group, the third group, the second group, and the first group may be arranged in the first direction. For some example, the first contact group G1, the second contact group G2, and the third contact group G3 may be sequentially and repeatedly arranged in the first direction.

In some example embodiments, the second A via contact 150a included in the first group G1 and line patterns under the second A via contact 150a may include the multi-via structure 250a, the short single via structure 250b, and the long single via structure 250c. In the first group G1, the multi-via structure 250a, the short single via structure 250b, and the long single via structure 250c may be regularly and repeatedly arranged.

In some example embodiments, the second B via contact 150b included in the second group G2 and line patterns under the second B via contact 150b may include the multi-via structure 252a, the short single via structure 252b, and the long single via structure 252c. In the second group G2, the multi-via structure 252a, the short single via structure 252b, and the long single via structure 252c may be regularly and repeatedly arranged.

In some example embodiments, the second C via contact 150c included in the third group G3 and line patterns under the second C via contact 150c may include the multi-via structure 254a and the single via structure 254b. In the third group G3, the multi-via structure 254a and the single via structure 254b may be regularly and repeatedly arranged.

As described above, the via contacts may be grouped depending on shapes in the same manner, and the via contacts may be regularly and repeatedly arranged. In the sample for analysis cut in the first direction or the second direction, groups of the via contacts may be presented at one cross-section of the sample. Therefore, different shapes of via contacts may be analyzed by using one the cross-section of the sample.

The surface of the pad pattern and the structure of the upper wiring may be more accurately analyzed by using the detection pad structure, and/or the number of samples for analysis may be reduced.

The foregoing is illustrative of some example embodiments and is not to be construed as limiting thereof. Although a few example embodiments have been described, those of ordinary skill in the art will readily appreciate that many modifications are possible in example embodiments without materially departing from the novel teachings and advantages of inventive concepts. Accordingly, all such modifications are intended to be included within the scope of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to example embodiments, as well as other example embodiments, are intended to be included within the scope of the appended claims.

What is claimed is:

1. A detection pad structure in a semiconductor device, comprising:
　　a lower wiring on a substrate;
　　an upper wiring on the lower wiring, the upper wiring electrically connected to the lower wiring, the upper wiring including metal patterns and via contacts on the metal patterns, the metal patterns and via contacts stacked in a plurality of layers; and
　　a first pad pattern on the upper wiring, the first pad pattern electrically connected to the upper wiring,
　　wherein the semiconductor device includes an actual upper wiring including actual metal patterns and actual via contacts and a second pad pattern on the actual upper wiring, and the actual metal patterns and actual via contacts are stacked in a plurality of layers,
　　at least one of the metal patterns of each layer in the upper wiring has a minimum line width and a minimum space, the minimum line width and the minimum space of the at least one of the metal patterns in the upper wiring corresponding to a minimum line width and a minimum space of a corresponding actual metal pattern of the actual upper wiring, and the metal patterns and via contacts of each layer in the upper wiring are regularly arranged and repeatedly arranged, wherein upper surfaces of the first and second pad patterns have the same size, and wherein the semiconductor device is a semiconductor chip or a semiconductor package including one or more detection pad structures arranged adjacent to an actual pad structure.

2. The detection pad structure of claim 1, wherein ones of the via contacts of each layer in the upper wiring are aligned in a vertical direction, the vertical direction perpendicular to an upper surface of the substrate.

3. The detection pad structure of claim 1, wherein the first pad pattern is electrically connected to the substrate only through the upper wiring and the lower wiring.

4. The detection pad structure of claim 1, wherein the metal patterns of each layer having a minimum line width and a minimum space corresponding to the minimum line width and the minimum space of the actual metal patterns in the actual upper wiring are at an edge portion, the edge portion has a rectangular ring shape, and the edge portion corresponds to a portion facing under an edge of the first pad pattern.

5. The detection pad structure of claim 4, wherein the metal patterns of each layer at the edge portion include a first line pattern extending in a first direction that is parallel to a surface of the substrate, a second line pattern extending in a second direction perpendicular to the first direction and parallel to the surface of the substrate, and an island pattern connecting ends of the first and second line patterns, the island pattern at a vertex portion of the edge portion.

6. The detection pad structure of claim 1, wherein the metal patterns of each layer at a center portion of the each layer have a line shape, and metal patterns adjacent to each other in a vertical direction that is perpendicular to an upper surface of the substrate extend to cross each other in a perpendicular direction, and an edge portion of the each layer corresponds to a portion facing under an edge of the first pad pattern, and the center portion of the each layer corresponds to a portion facing under an inside of the edge of the first pad pattern.

7. The detection pad structure of claim 1, wherein the via contacts of each layer at a center portion are within a line width of a metal pattern contacting a bottom of each of the via contacts, and at least one of the via contacts is on the line width of the metal pattern, and an edge portion corresponds to a portion facing under an edge of the first pad pattern, and the center portion corresponds to a portion facing under an inside of the edge of the first pad pattern.

8. A detection pad structure in a semiconductor device, comprising:

a first pad pattern apart from an upper surface of a substrate;

a first detection upper wiring stack between the substrate and the first pad pattern, the first pad pattern is on and electrically connected to the first detection upper wiring stack, the first pad pattern including metal patterns stacked in a plurality of layers, and the first detection upper wiring stack configured to analyze a line width and a line space of the metal patterns of each layer, the metal patterns at an edge portion, the edge portion having a rectangular ring shape and corresponding to a portion facing under the first pad pattern; and a second detection lower wiring stack between the substrate and the first pad pattern stacked in a vertical direction that is perpendicular to the upper surface of the substrate, the second detection lower wiring stack including metal patterns and via contacts on the metal patterns stacked in a plurality of layers, the second detection lower wiring stack at a center portion corresponding to a portion facing under an inside of the edge portion, wherein the first pad pattern is electrically connected to the substrate only through the first detection upper wiring stack and the second detection lower wiring stack.

9. The detection pad structure of claim 8, wherein the semiconductor device includes an actual upper wiring including actual metal patterns and actual via contacts, the actual metal patterns and the actual via contacts stacked in a plurality of layers, and at least one of the metal patterns of each layer at the edge portion has a minimum line width corresponding to a minimum line width of the actual metal patterns of each layer in the actual upper wiring, and the at least one of the metal patterns of each layer at the edge portion has a minimum space corresponding to a minimum space of the actual metal patterns of each layer in the actual upper wiring.

10. The detection pad structure of claim 9, wherein the metal patterns of each layer at the edge portion include a first line pattern extending in a first direction that is parallel to a surface of the substrate, a second line pattern extending in a second direction that is perpendicular to the first direction and parallel to the surface of the substrate, and an island pattern connecting ends of the first and second line patterns at a vertex portion of the edge portion.

11. The detection pad structure of claim 10, further comprising:

a via contact on the island patterns of each layer, the via contact electrically connected the island patterns adjacent to each other in the vertical direction.

12. The detection pad structure of claim 8, wherein metal patterns having different line widths are under the via contacts of each layer at the center portion, and at least one of the via contacts are on the metal patterns having the different line widths.

13. The detection pad structure of claim 8, wherein the first detection upper wiring stack and the second detection lower wiring stack of each layer are electrically connected to each other.

14. The detection pad structure of claim 8, wherein ones of the via contacts of each layer positioned at the center portion are aligned to each other in the vertical direction.

15. The detection pad structure of claim 8, wherein the metal patterns of each layer at the center portion have a line shape, and metal patterns adjacent to each other in the vertical direction extend to cross each other in a perpendicular direction.

16. The detection pad structure of claim 8, wherein an uppermost metal pattern immediately below the first pad pattern is at the edge portion and not at a center portion.

17. The detection pad structure of claim 16, wherein a first via contact is on an upper surface of the uppermost metal pattern and a second via contact is on a lower surface of the uppermost metal pattern.

18. A detection pad structure in a semiconductor device, comprising:

lower wirings on a substrate;

a first upper wiring on the lower wirings, the first upper wiring including a first metal pattern and a first via contact on the first metal pattern;

a second upper wiring on the first upper wiring, the second upper wiring including a second metal pattern and a second via contact on the second metal pattern;

a third upper wiring on the second upper wiring, the third upper wiring including a third metal pattern and a third via contact on the third metal pattern;

a fourth upper wiring on the third upper wiring, the fourth upper wiring including a fourth metal pattern and a fourth via contact on the fourth metal pattern;

an uppermost wiring on the fourth upper wiring, the upper wiring including an uppermost metal pattern and an uppermost via contact; and a first pad pattern on the uppermost wiring, wherein each of the first, second, third, and fourth metal patterns and the upper wiring are between the substrate and the first pad pattern arranged in a vertical direction that is perpendicular to an upper surface of the substrate, and each of the first, second, third, and fourth metal patterns and the upper wiring has an edge portion of a rectangular ring shape corresponding to an edge of the first pad pattern, each of the first, second, and third metal patterns and the first, second, and third via contacts are between the substrate and the first pad pattern in the vertical direction, and each of the first, second and third metal patterns and the first, second, and third via contacts are at a center portion, the center portion corresponding a portion facing under of an inside of the edge of the first pad pattern, and each of the first, second and third via contacts at the center portion is within a line width of each of the first, second and third metal patterns contacting bottoms of each of the first, second and third via contacts, and at least one of the first, second, and third via contacts is on the line width of a respective one of the first, second and third metal pattern.

19. The detection pad structure of claim 18, wherein the semiconductor device includes an actual upper wiring including actual metal patterns and actual via contacts, and the actual metal patterns and actual via contacts are stacked in a plurality of layers, and at least one of the uppermost metal pattern positioned at the edge portion, the first, second, third, or fourth metal patterns have a minimum line width and a minimum space of the actual metal patterns of each layer in the actual upper wiring.

20. The detection pad structure of claim 18, wherein the uppermost metal pattern is at the edge portion and not at a center portion, and the uppermost via contact and the fourth via contact are at the edge portion and not at a center portion.

* * * * *